US007371504B2

(12) United States Patent
Nakamura

(10) Patent No.: US 7,371,504 B2
(45) Date of Patent: May 13, 2008

(54) LITHOGRAPHIC PRINTING PLATE PRECURSOR

(75) Inventor: Ippei Nakamura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/754,511

(22) Filed: Jan. 12, 2004

(65) Prior Publication Data

US 2004/0157152 A1 Aug. 12, 2004

(30) Foreign Application Priority Data

Jan. 14, 2003 (JP) .......................... P.2003-006093

(51) Int. Cl.
*G03F 7/00* (2006.01)
*G03F 7/004* (2006.01)

(52) U.S. Cl. .............................. 430/270.1; 430/271.1; 430/273.1; 430/302; 430/944; 430/945; 101/453

(58) Field of Classification Search ............. 430/270.1, 430/271.1, 273.1, 302, 944, 945; 101/453
See application file for complete search history.

(56) References Cited

U.S. PATENT DOCUMENTS

| | | | | |
|---|---|---|---|---|
| 6,153,353 | A * | 11/2000 | Van Damme et al. | 430/270.1 |
| 6,492,093 | B2 | 12/2002 | Gaschler et al. | |
| 6,555,291 | B1 * | 4/2003 | Hauck | 430/302 |
| 6,808,857 | B2 | 8/2007 | Miyamoto et al. | |
| 2002/0006575 | A1 | 1/2002 | Gaschler et al. | |
| 2002/0081522 | A1 | 6/2002 | Miyake et al. | |
| 2003/0087177 | A1 | 5/2003 | Miyamoto et al. | |
| 2004/0152018 | A1 * | 8/2004 | Arias et al. | 430/273.1 |

FOREIGN PATENT DOCUMENTS

| | | | |
|---|---|---|---|
| EP | 909 657 | A2 * | 4/1999 |
| JP | 2000-206687 | A | 7/2000 |
| JP | 2002-341536 | A | 11/2002 |
| JP | 2003-270780 | A | 9/2003 |

* cited by examiner

*Primary Examiner*—Amanda Walke
(74) *Attorney, Agent, or Firm*—Sughrue Mion, PLLC

(57) ABSTRACT

A lithographic printing plate precursor capable of forming an image upon irradiation with an infrared laser comprising a support, a first layer containing as the main component an alkali-soluble resin and a second layer containing as the main component an alkali-soluble resin that is different from the alkali-soluble resin contained as the main component in the first layer in this order, and at least one of the first layer and the second layer contains a mixture comprising at least two kinds of infrared absorbing agents.

9 Claims, No Drawings

LITHOGRAPHIC PRINTING PLATE PRECURSOR

FIELD OF THE INVENTION

The present invention relates to a lithographic printing plate precursor, and more specifically relates to a so-called direct plate-making heat-sensitive positive-working lithographic printing plate precursor capable of being subjected to direct plate-making by scanning with an infrared laser based on digital signals of a computer or the like.

BACKGROUND OF THE INVENTION

The progress of lasers in recent years has been remarkable and a high output and compact solid laser or semiconductor laser having a light emission region in the range from near infrared to infrared becomes easily available. These lasers are very useful as a light source for exposure in conducting the direct plate-making from digital data of a computer or the like.

A positive-working recording layer (hereinafter referred to as an image-forming layer) contains a binder resin soluble in an aqueous alkali solution and a dissolution inhibiting agent, which substantially decreases a solubility of the binder resin upon the interaction with the binder resin. Among them, the image-forming layer using an infrared laser for exposure preferably contains an infrared absorbing agent, for example, an infrared absorbing dye, which absorbs light and generates heat, in addition to the binder resin and the dissolution inhibiting agent.

Of the infrared absorbing agents, a cyanine dye is particularly preferably used as the infrared absorbing agent for the image-forming layer responding to an infrared laser, because it has also a function of the dissolution inhibiting agent.

However, in such a positive-working lithographic printing plate precursor for an infrared laser, there is a problem in that the difference between the dissolution resistance of the unexposed areas (image areas) to a developer and the solubility of the exposed areas (non-image areas) is yet insufficient under various using conditions, and an excessive development or an inferior development is liable to occur by the fluctuation of the using conditions.

Further, although an energy sufficient for an image-forming reaction can be obtained on the surface of the photosensitive lithographic printing plate precursor irradiated with a laser, diffusion of heat occurs. Particularly, in case of using a conventional aluminum support, there is a problem in that since the aluminum support has a good hest conductivity, the diffusion of heat to the support is severe and the energy cannot be sufficiently utilized for the image formation, resulting in low sensitivity.

In order to resolve such a problem, a method of providing an undercoat layer excellent in alkali solubility between the support and the image-forming layer has been proposed. In accordance with the method, after the imagewise exposure the undercoat layer excellent in alkali solubility is revealed in the exposed region by removal of the image-forming layer and an effect of smooth removal of an undesirable remaining film or the like with an alkali developer and an effect of efficiently restraining the diffusion of heat to the support due to the function of the undercoat layer as a heat insulating layer are achieved. As an image-forming material having a multi-layer structure, there is described a photosensitive image-forming material for an infrared laser comprising an upper layer having incorporated therein a conventional cyanine dye (refer to, for example, Patent Document 1).

However, from the standpoints of achieving high sensitivity regardless of variation on the light source of an exposure apparatus used for the image formation, obtaining a large allowance to fluctuation of concentration in the alkali developer (development latitude), and increasing storage stability of preventing, for example, the occurrence of aggregation of the infrared absorbing dye with the lapse of time, further improvements have been desired under the present situation.

Patent Document 1: JP-A-11-218914 (the term "JP-A" as used herein means an "unexamined published Japanese patent application")

SUMMARY OF THE INVENTION

Therefore, an object of the present invention is to resolve the above-described problems, and specifically, to provide a lithographic printing plate precursor for a direct plate-making, which has high sensitivity regardless of variation on the light source of an exposure apparatus used at the image formation, has a large allowance to fluctuation of concentration in the alkali developer and is excellent in the storage stability (preservation stability) of preventing, for example, fluctuation of sensitivity due to the occurrence of aggregation of the infrared absorbing dye with the lapse of time.

Other objects of the invention will become apparent from the following description.

As the result of extensive investigations, it has been found that the above described objects can be attained by incorporating a mixture comprising at least two kinds of infrared absorbing agents into at least one of the first layer and the second layer, preferably into the second layer, of a positive-working lithographic printing plate precursor having an image-forming layer of a multi-layer structure.

Specifically, the invention includes the following construction.

1. A lithographic printing plate precursor capable of forming an image upon irradiation with an infrared laser comprising a support, a first layer containing as the main component an alkali-soluble resin and a second layer containing as the main component an alkali-soluble resin that is different from the alkali-soluble resin contained as the main component in the first layer in this order, and at least one of the first layer and the second layer contains a mixture comprising at least two kinds of infrared absorbing agents.

Preferred embodiments of the invention are described below.

2. The lithographic printing plate precursor as described in item 1 above, wherein the second layer contains the mixture comprising at least two kinds of infrared absorbing agents.
3. The lithographic printing plate precursor as described in item 1 or 2 above, wherein the mixture comprises at least two kinds of infrared absorbing agents having absorption maximum wavelengths different from each other.
4. The lithographic printing plate precursor as described in item 3 above, wherein difference of the absorption maximum wavelengths is not less than 15 nm.
5. The lithographic printing plate precursor as described in item 3 above, wherein difference of the absorption maximum wavelengths is not more than 50 nm.

6. A lithographic printing plate precursor capable of forming an image upon irradiation with an infrared laser comprising a support, a first layer containing as the main component an alkali-soluble resin and a second layer containing (a) an alkali-soluble resin that is different from the alkali-soluble resin contained as the main component in the first layer and (b) a mixture comprising at least one kind of infrared absorbing agent having an absorption maximum wavelength of not shorter than 825 nm and at least one kind of infrared absorbing agent having an absorption maximum wavelength of shorter than 825 nm in this order.

DETAILED DESCRIPTION OF THE INVENTION

The lithographic printing plate precursor of the invention has the multi-layer structure containing at least two kinds of infrared absorbing agents in at least one of the first layer and the second layer, preferably in the second layer, as described above. Thus, the lithographic printing plate precursor, which has high sensitivity regardless of a kind of the exposure apparatus used at the image formation, that is, an exposure wavelength, has a large allowance to fluctuation of concentration in the alkali developer and is excellent in the storage stability (preservation stability) of preventing the occurrence of fluctuation of sensitivity with the lapse of time, can be obtained.

A mechanism of the function of infrared absorbing agents in the constitution of the lithographic printing plate precursor according to the invention is assumed as follows, although it is not quite clear.

Specifically, the mixture of at least two kinds of infrared absorbing agents used in the lithographic printing plate precursor according to the invention, particularly, the mixture of infrared absorbing agents comprising at least one kind of infrared absorbing agent having an absorption maximum wavelength of not shorter than 825 nm and at least one kind of infrared absorbing agent having an absorption maximum wavelength of shorter than 825 nm used preferably in the second layer of the lithographic printing plate precursor makes light absorption over a wide range possible in comparison with a case wherein only one infrared absorbing agent is used. As a result, it is believed that the lithographic printing plate precursor can exhibit high sensitivity to various exposure apparatus having different types of exposure light sources. It is also believed that, when two or more kinds of conventionally used infrared absorbing agents as typified by cyanine dyes are employed in combination, change of absorption wavelength resulting from the aggregation of dye, etc. in the photosensitive layer (image-forming layer) and isolation of the dye from the photosensitive layer due to the crystallization thereof are hardly occurred so that the storage stability of photosensitive lithographic printing plate precursor can be improved. Further, in general, in a photosensitive material having a multi-layer structure composed of laminate of thin layers as the lithographic printing plate precursor of the invention, the concentration of infrared absorbing agent tends to increase, thereby resulting in deterioration of the storage stability of photosensitive material. However, it is assumed that the remarkably improved effects of the invention can be achieved by using two or more kinds of infrared absorbing agents in combination with the multi-layer structure.

The lithographic printing plate precursor of the invention will be described in more detail below.

The lithographic printing plate precursor of the invention is characterized by comprising a support, a first layer containing as the main component an alkali-soluble resin and a second layer containing as the main component an alkali-soluble resin that is different from the alkali-soluble resin contained as the main component in the first layer in this order, and at least one of the first layer and the second layer, preferably the second layer, contains a mixture comprising at least two kinds of infrared absorbing agents.

According to a preferred embodiment of the invention, the mixture comprising at least two kinds of infrared absorbing agents comprises at least two kinds of infrared absorbing agents having absorption maximum wavelengths different from each other. The difference of the absorption maximum wavelengths of the infrared absorbing agents is preferably not less than 15 nm, and more preferably not more than 50 nm.

According to another preferred embodiment of the invention, the lithographic printing plate precursor is characterized by comprising a support, a first layer containing as the main component an alkali-soluble resin and a second layer containing (a) an alkali-soluble resin that is different from the alkali-soluble resin contained as the main component in the first layer and (b) a mixture comprising at least one kind of infrared absorbing agent having an absorption maximum wavelength of not shorter than 825 nm and at least one kind of infrared absorbing agent having an absorption maximum wavelength of shorter than 825 nm in this order.

The first layer and second layer described above are provided as an image-forming layer, and the first layer is provided close to the support and the second layer is provided as the uppermost layer (exposure surface). Between the support and the first layer and/or between the first layer and the second layer, other layers may further be provided. Now, each of the components incorporated into the second layer of the lithographic printing plate precursor according to the invention is described below.

[Second Layer]

The second layer (upper image-forming layer) according to the invention is a layer provided as an upper layer on the first layer (lower image-forming layer) described hereinafter. The second layer contains as the main component an alkali-soluble resin that is different from the alkali-soluble resin contained as the main component in the first layer. At least one of the first layer and the second layer contains a mixture comprising at least two kinds of infrared absorbing agents. Preferably, the second layer contains a mixture comprising at least one kind of infrared absorbing agent having an absorption maximum wavelength of not shorter than 825 nm and at least one kind of infrared absorbing agent having an absorption maximum wavelength of shorter than 825 nm. [Mixture comprising at least one kind of infrared absorbing agent having an absorption maximum wavelength of not shorter than 825 nm and at least one kind of infrared absorbing agent having an absorption maximum wavelength of shorter than 825 nm]

In the lithographic printing plate precursor according to the invention, the above described mixture of infrared absorbing agents is preferably added to the second layer (upper image-forming layer) of the image-forming layer and works as the infrared absorbing agent as described above. Hereinafter, the mixture of infrared absorbing agents is also referred to as "a specific infrared absorbing agent".

According to the invention, a lithographic printing plate precursor, which has high sensitivity regardless of variation on the light source of an exposure apparatus used at the image formation, has a large allowance to fluctuation of concentration in the alkali developer and is excellent in the preservation stability of preventing, for example, the occurrence of aggregation of the infrared absorbing dye with the lapse of time, can be obtained by using the above-described specific infrared absorbing agent.

The term "absorption maximum wavelength" as used herein with respect to the infrared absorbing agent for use in the invention means a value obtained by dispersing the above-described mixture of infrared absorbing agents in a phenol resin, which is frequently used in the second layer to form a film and measuring the film according to a transmission method. The value adopted herein is obtained by using a cresol novolak resin as the phenol resin.

The infrared absorbing agent for use in the lithographic printing plate precursor according to the invention is employed without any particular restriction on the absorption wavelength range thereof as long as a substance that absorbs an infrared ray and generates heat. In view of the compatibility with an easily available high power laser, infrared absorbing dyes and pigments each having an absorption maximum in a wavelength range of from 700 to 1,200 nm are preferably exemplified. It is preferred to select an infrared absorbing agent having an absorption maximum wavelength of not shorter than 825 nm and an infrared absorbing agent having an absorption maximum wavelength of shorter than 825 nm from these dyes and pigments to use in combination.

Examples of the pigment used as the infrared absorbing agent in the invention include commercially available pigments and pigments described in Colour Index (C.I.), Nippon Ganryo Gijutu Kyokai ed., *Saishin Ganryo Binran* (*Handbook of the Newest Pigments*) (1977), *Saishin Ganryo Oyou Gijutsu* (*Newest Application Techniques for Pigments*), CMC Publishing Co., Ltd. (1986) and *Insatsu Inki Gijutsu* (*Printing Ink Technology*), CMC Publishing Co., Ltd. (1984). From the standpoints of ease of dispersion in the image-forming layer and ease of modifying spectral characteristics, it is more preferred to use a dye as the infrared absorbing agent.

Examples of the dye for use in the invention include commercially available dyes and known dyes described in literature, for example, Yuki Gosei Kagaku Kyokai ed., *Senryo Binran* (*Handbook of Dyes*) (1970)). Specific examples thereof include dyes, for example, azo dyes, metal complex salt azo dyes, pyrazolone azo dyes, naphthoquinone dyes, anthraquinone dyes, phthalocyanine dyes, naphthalocyanine dyes, carbonium dyes, quinonimine dyes, methine dyes, cyanine dyes, squarylium dyes, (thio)pyrylium dyes, metal thiolate dyes, indoaniline metal complex dyes, oxonol dyes, diimonium dyes, aminium dyes, croconium dyes or intermolecular CT dyes.

Preferred examples of the dye include cyanine dyes described, for example, in JP-A-58-125246, JP-A-59-84356, JP-A-59-202829 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792 and cyanine dyes described in British Patent 434,875.

Other preferred examples of the dye include near infrared absorbing sensitizers described in U.S. Pat. No. 5,156,938, substituted arylbenzo(thio)pyrylium salts described in U.S. Pat. No. 3,881,924, trimethinethiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, pyrylium compounds described in JP-B-5-13514 (the term "JP-B" as used herein means an "examined Japanese patent publication") and JP-B-5-19702.

Of the dyes, cyanine dyes, phthalocyanine dyes, oxonol dyes, squarylium dyes, pyrylium salts, (thio)pyrylium dyes and nickel thiolate complexes are more preferred, and cyanine dyes are particularly preferred.

Further, dyes represented by formulae (a) to (f) are preferred because they are excellent in light-heat conversion efficiency. Particularly, the cyanine dyes represented by formula (a) are most preferred since they exhibit a large mutual interaction with the alkali-soluble resin and are excellent in the image-forming property when they are used in the image-forming layer of the invention.

(a)

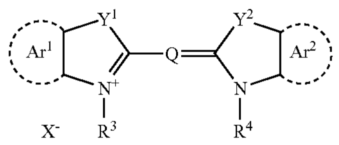

In formula (a), $R^3$ and $R^4$ each independently represent an alkyl group having from 1 to 12 carbon atoms, which may have a substituent selected from an alkoxy group, an aryl group, an amido group, an alkoxycarbonyl group, a hydroxy group, a sulfo group and a carboxy group. $Y^1$ and $Y^2$ each independently represent an oxygen atom, a sulfur atom, a selenium atom, a dialkylmethylene group or —CH═CH—. $Ar^1$ and $Ar^2$ each independently represent an aromatic hydrocarbon group, which may have a substituent selected from an alkyl group, an alkoxy group, a halogen atom and an alkoxycarbonyl group, or $Ar^1$ and $Ar^2$ each may form a condensed aromatic ring together with the adjacent two carbon atoms connected to $Y^1$ or $Y^2$.

$X^-$ represents a counter ion necessary for neutralization of charge, and it is not always necessary in the case wherein the dye cation portion has an anionic substituent. Q represents a polymethine group selected from a trimethine group, a pentamethine group, a heptamethine group, a nonamethine group and a undecamethine group. A pentamethine group, a heptamethine group or a nonamethine group is preferable in view of the wavelength aptitude to an infrared ray for use at the exposure and the stability. A polymethine group containing a cyclohexene ring or a cyclopentene ring formed by any adjacent three methine groups is preferred from the standpoint of the stability.

The polymethine group represented by Q may be substituted with a substituent selected from an alkoxy group, an aryloxy group, an alkylthio group, an arylthio group, a dialkylamino group, a diarylamino group, a halogen atom, an alkyl group, an aralkyl group, a cycloalkyl group, an aryl group, an oxy group, an iminium salt group and a group represented by formula (2) shown below. Preferred examples of the substituent include a halogen atom, for example, a chlorine atom, a diarylamino group, for example, a diphenylamino group and an arylthio group, for example, a phenylthio group.

(2)

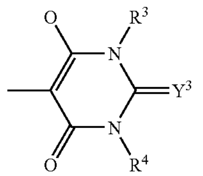

wherein $R^3$ and $R^4$ each independently represent a hydrogen atom, an alkyl group having from 1 to 8 carbon atoms or an aryl group having from 6 to 10 carbon atoms; and $Y^3$ represents an oxygen atom or a sulfur atom.

Of the cyanine dyes represented by formula (a), heptamethinecyanine dyes represented by formulae (a-1) to (a-4) shown below are particularly preferred in the case of exposure using an infrared ray having a wavelength of from 800 to 840 nm.

(a-1)

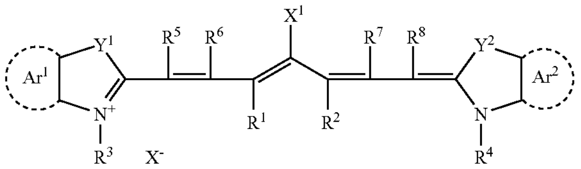

In formula (a-1), $X^1$ represents a hydrogen atom or a halogen atom. $R^1$ and $R^2$ each independently represent a hydrocarbon group having from 1 to 12 carbon atoms. From the standpoint of preservation stability of a coating solution for the image-forming layer, $R^1$ and $R^2$ each preferably represent a hydrocarbon group having not less than 2 carbon atoms, and $R^1$ and $R^2$ are particularly preferably connected with each other to form a 5-membered or 6-membered ring.

$Ar^1$ and $Ar^2$, which may be the same or different, each represent an aromatic hydrocarbon group, which may have a substituent. Preferred examples of the aromatic hydrocarbon group include a benzene ring and a naphthalene ring. Preferred examples of the substituent include a hydrocarbon group having not more than 12 carbon atoms, a halogen atom and an alkoxy group having not more than 12 carbon atoms. $Y^1$ and $Y^2$, which may be the same or different, each represent a sulfur atom or a dialkylmethylene group having not more than 12 carbon atoms. $R^3$ and $R^4$, which may be the same or different, each represent a hydrocarbon group having not more than 20 carbon atoms, which may have a substituent. Preferred examples of the substituent include an alkoxy group having not more than 12 carbon atoms, a carboxy group and a sulfo group. $R^5$, $R^6$, $R^7$ and $R^8$, which may be the same or different, each represent a hydrogen atom or a hydrocarbon group having not more than 12 carbon atoms. From the standpoint of the availability of raw materials, $R^5$, $R^6$, $R^7$ and $R^8$ are preferably hydrogen atoms. $X^-$ represents a counter anion necessary for neutralization of charge, and it is not necessary in the case wherein any one of $R^1$ to $R^8$ is substituted with an anionic substituent. From the standpoint of preservation stability of a coating solution for the image-forming layer, $X^-$ preferably represents a halogen ion, a perchlorate ion, a tetrafluoroborate ion, a hexafluorophosphate ion or a sulfonate ion, and particularly preferably a perchlorate ion, a tetrafluoroborate ion, a hexafluorophosphate ion or a sulfonate ion. The heptamethine dye represented by formula (a-1) is preferably used in the lithographic printing plate precursor of the invention, and particularly preferably used together with an alkali-soluble resin having a phenolic hydroxy group therein.

(a-2)

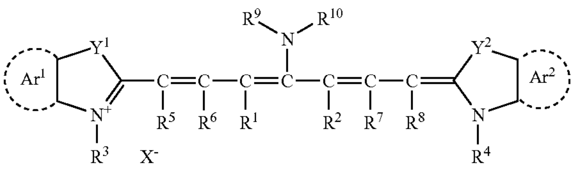

In formula (a-2), $R^1$ and $R^2$ each independently represent a hydrogen atom or a hydrocarbon group having from 1 to 12 carbon atoms, or $R^1$ and $R^2$ may be connected with each other to form a ring structure. The ring formed is preferably a 5-membered or 6-membered ring, and particularly preferably a 5-membered ring. $Ar^1$ and $Ar^2$, which may be the same or different, each represent an aromatic hydrocarbon group, which may have a substituent. Preferred examples of the aromatic hydrocarbon group include a benzene ring and a naphthalene ring. Preferred examples of the substituent on the aromatic hydrocarbon group include a hydrocarbon group having not more than 12 carbon atoms, a halogen atom, an alkoxy group having not more than 12 carbon atoms, an alkoxycarbonyl group, an alkylsulfonyl group and a halogenated alkyl group. An electron withdrawing substituent is particularly preferred for the substituent on the aromatic hydrocarbon group. $Y^1$ and $Y^2$, which may be the same or different, each represent a sulfur atom or a dialkylmethylene group having not more than 12 carbon atoms. $R^3$ and $R^4$, which may be the same or different, each represent a hydrocarbon group having not more than 20 carbon atoms, which may have a substituent. Preferred examples of the substituent include an alkoxy group having not more than 12 carbon atoms, a carboxy group and a sulfo group. $R^5$, $R^6$, $R^7$ and $R^8$, which may be the same or different, each represent a hydrogen atom or a hydrocarbon group having not more than 12 carbon atoms. From the standpoint of the availability of raw materials, $R^5$, $R^6$, $R^7$ and $R^8$ are preferably hydrogen atoms. $R^9$ and $R^{10}$, which may be the same or different, each represent an aromatic hydrocarbon group having from 6 to 10 carbon atoms, which may have a substituent, an alkyl group having from 1 to 8 carbon atoms or a hydrogen atom, or $R^9$ and $R^{10}$ may be connected with each other to form a ring structure shown below:

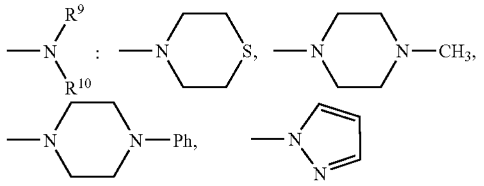

Of the above-described groups for $R^9$ and $R^{10}$, the aromatic hydrocarbon group, for example, a phenyl group is particularly preferred.

$X^-$ in formula (a-2) represents a counter ion necessary for neutralization of charge, and has the same meaning as $X^-$ in formula (a-1). The heptamethine dye represented by formula (a-2) is preferably used together with an acid and/or radical generating agent, for example, an onium salt, and particularly preferably used together with a radical generating agent, for example, a sulfonium salt or an iodonium salt.

(a-3)

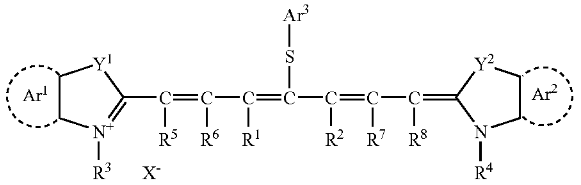

In formula (a-3), $R^1$ to $R^8$, $Ar^1$, $Ar^2$, $Y^1$, $Y^2$ and $X^-$ each have the same meanings as defined in formula (a-2) $Ar^3$ represents an aromatic hydrocarbon group, for example, a phenyl group or a naphthyl group or a monocyclic or polycyclic heterocyclic group containing at least one of a nitrogen atom, an oxygen atom and a sulfur atom, and is preferably the heterocyclic group selected from a thiazole-base, a benzothiazole-base, a naphthothiazole-base, a thianaphtheno-7',6',4,5-thiazole-base, an oxazole-base, a benzoxazole-base, a naphthoxazole-base, a selenazole-base, a benzoselenazole-base, a naphthoselenazole-base, a thiazoline-base, a 2-quinoline-base, a 4-quinoline-base, a 1-isoquinoline-base, a 3-isoquinoline-base a benzimidazole-base, a 3,3-dialkylbenzindolenine-base, a 2-pyridine-base, a 4-pyridine-base, a 3,3-dialkylbenz[e]indole-base, a tetrazole-base, a triazole-base, a pyrimidine-base, and a thiadiazole-base. As the particularly preferable heterocyclic groups, are exemplified those having the following structures:

$Ar^3$:

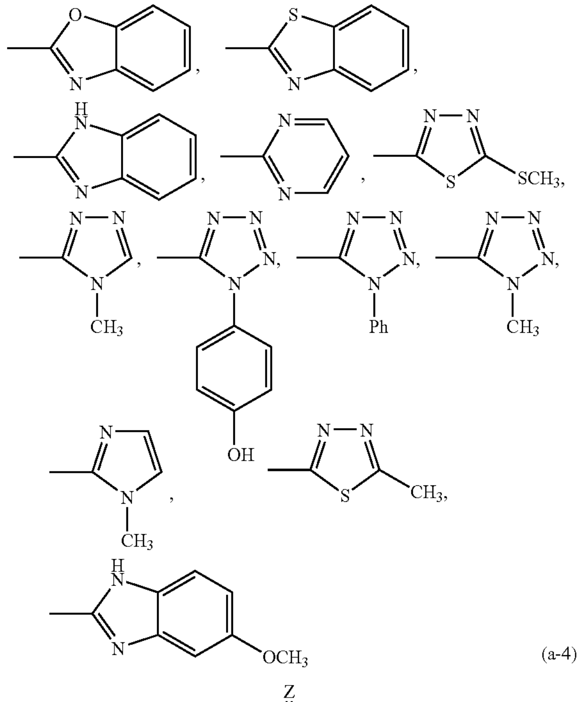

(a-4)

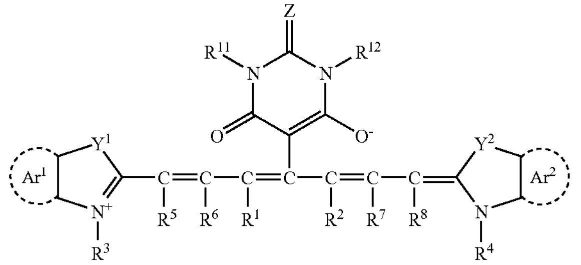

In formula (a-4), $R^1$ to $R^8$, $Ar^1$, $Ar^2$, y and $Y^2$ each have the same meanings as defined in formula (a-2). $R^1$ represents an allyl group, a cyclohexyl group or an alkyl group having from 1 to 8 carbon atoms. Z represents an oxygen atom or a sulfur atom.

(b)

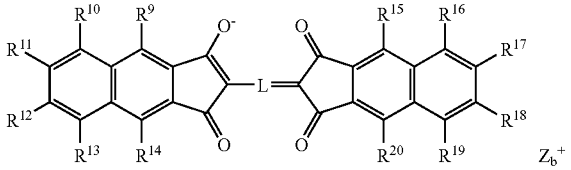

In formula (b), L represents a methine chain having not less than 7 conjugated carbon atoms. The methine chain may have a substituent, and the substituent may be connected with each other to form a ring structure. $Z_b^+$ represents a counter cation. Preferred examples of the counter cation include ammonium, iodonium, sulfonium, phosphonium, pyridinium and an alkali metal cation, for example, $Na^+$, $K^+$ or $Li^+$. $R^9$ to $R^{14}$ and $R^{15}$ to $R^{20}$ each independently represent a hydrogen atom, a substituent selected from a halogen atom, a cyano group, an alkyl group, an aryl group, an alkenyl group, an alkynyl group, a carbonyl group, a thio group, a sulfonyl group, a sulfinyl group, an oxy group and an amino group or a substituent formed by combining two or three of these substituents, or may be connected with each other to form a ring structure. Of the compounds represented by formula (b), those in which L represents a methine chain having 7 conjugated carbon atoms and all of $R^9$ to $R^{14}$ and $R^{15}$ to $R^{20}$ represent hydrogen atoms are preferred from the standpoints of the ease of availability and the effect obtained.

(c)

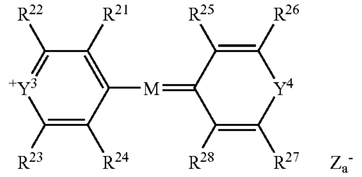

In formula (c), $Y^3$ and $Y^4$ each represent an oxygen atom, a sulfur atom, a selenium atom or a tellurium atom. M represents a methine chain having not less than 5 conjugated carbon atoms. $R^{21}$ to $R^{24}$ and $R^{25}$ to $R^{28}$, which may be the same or different, each represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. $Z_a^-$ represents a counter anion and has the same meaning as $X^-$ in formula (a) above.

(d)

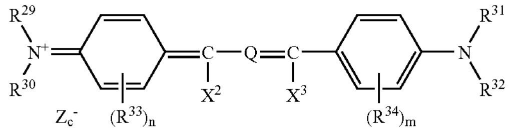

In formula (d), $R^{29}$ to $R^{32}$ each independently represent a hydrogen atom, an alkyl group or an aryl group. $R^{33}$ and $R^{34}$ each independently represent an alkyl group, a substituted oxy group or a halogen atom. n and m each independently represent an integer of from 0 to 4. $R^{29}$ and $R^{30}$ or $R^{31}$ and $R^{32}$ may be connected with each other to form a ring. Also, $R^{29}$ and/or $R^{30}$ and $R^{33}$, or $R^{31}$ and/or $R^{32}$ and $R^{34}$ may be connected with each other to form a ring. Further, when plural $R^{33}$s or $R^{34}$s are present, the $R^{33}$s or $R^{34}$s may be connected with each other to form a ring. $X^2$ and $X^3$ each independently represent a hydrogen atom, an alkyl group or an aryl group. Q represents a trimethine group that may have a substituent or a pentamethine group that may have a substituent, or may form a ring structure together with a divalent organic group. $Z_c^-$ represents a counter anion and has the same meaning as $X^-$ in formula (a) above.

(e)

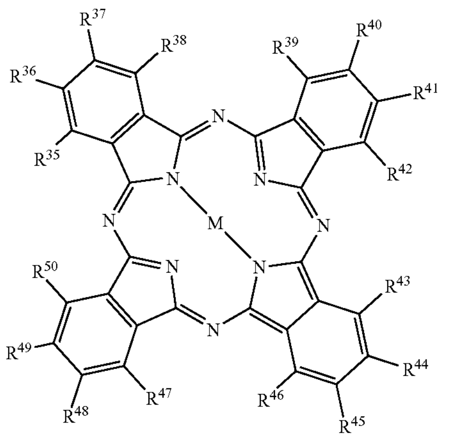

In formula (e), $R^{35}$ to $R^{50}$ each independently represent a hydrogen atom, a halogen atom, a cyano group or a hydroxy group, or an alkyl group, an aryl group, an alkenyl group, an alkynyl group, a carbonyl group, a thio group, a sulfonyl group, a sulfinyl group, an oxy group, an amino group or an onium structure, each of which may have a substituent. M represents two hydrogen atoms or a metal atom, a halometal group or an oxymetal group. The metal atom used herein includes atoms belonging to Groups IA, IIA, IIIB and IVB, transition metals of the first, second and third periods and lanthamide elements in Periodic Table. Of the metal atoms, copper, nickel, magnesium, iron, zinc, tin, cobalt, aluminum, titanium and vanadium are preferred, and vanadium, nickel, zinc and tin are particularly preferred. The metal atom may be connected to a halogen atom or oxygen atom to form the halometal group or oxymetal group, etc. in order to control the atomic valence.

(f-1)

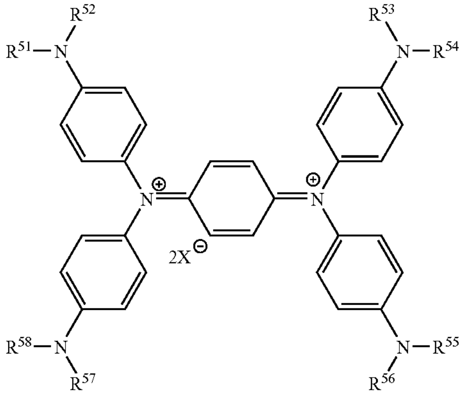

-continued (f-2)

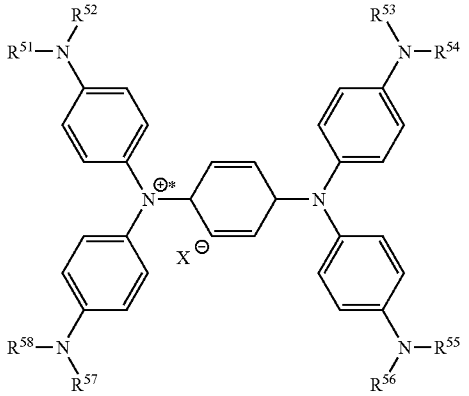

In formulae (f-1) and (f-2), $R^{51}$ to $R^{58}$ each independently represent a hydrogen atom, an alkyl group that may has a substituent or an aryl that may has a substituent. $X^-$ represents a counter anion and has the same meaning as $X^-$ in formula (a-2) above.

As the infrared absorbing agents other than those described above, for example, dyes having plural chromophores described in JP-A-2001-242613, dyes wherein chromophores are connected to a polymer compound with covalent bonds described in JP-A-2002-97384 and U.S. Pat. No. 6,124,425, anionic dyes describe in U.S. Pat. No. 6,248,893 and dyes having a surface orientation group described in JP-A-2001-347765 are preferably used.

Specific examples (Compounds L-1 to L-33) of the infrared absorbing agent having an absorption maximum wavelength of not shorter than 825 nm and specific examples (Compounds S-1 to S-32) of the infrared absorbing agent having an absorption maximum wavelength of shorter than 825 nm are set forth below, but the invention should not be construed as being limited thereto.

Infrared Absorbing Agent Having Absorption Maximum Wavelength of Not Shorter Than 825 nm

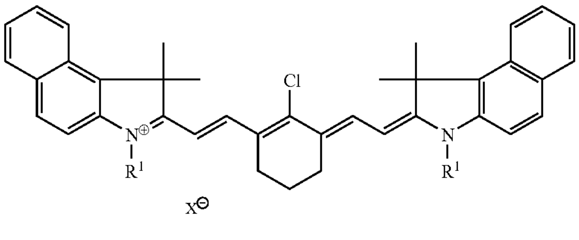

| | $R^1$ | $X^-$ | $\lambda_{max}$ (nm) |
|---|---|---|---|
| L-1 | $CH_3$ | $ClO_4^-$ | 840 |
| L-2 | $CH_3$ | 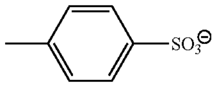 | 840 |
| L-3 | $CH_2COOH$ | $ClO_4^-$ | 838 |
| L-4 | $CH_3$ | $I^-$ | 840 |
| L-5 | $CH_2CH_3$ | $I^-$ | 841 |
| L-6 | $CH_2CH_3$ | $BF_4^-$ | 841 |
| L-7 | $CH_2(CH_2)_2CH_3$ | $I^-$ | 844 |

-continued
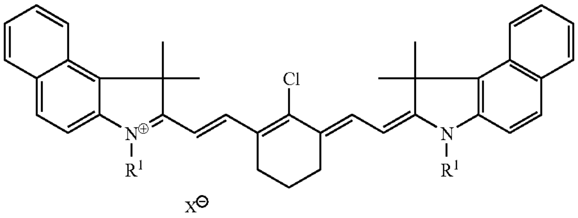
| | $R^1$ | $X^-$ | $\lambda_{max}$ (nm) |
|---|---|---|---|
| L-8 | $CH_2(CH_2)_4CH_3$ | 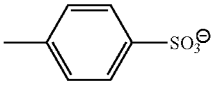 | 845 |
| L-9 | $CH_2CH_2OH$ | $ClO_4^-$ | 845 |
| L-10 | $CH_2CH{=}CH_2$ | $I^-$ | 844 |
| L-11 | $CH_3$ | 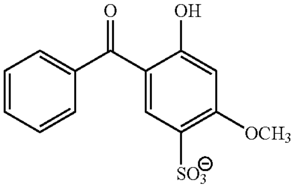 | 840 |
| L-12 | $CH_3$ | 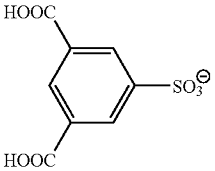 | 840 |
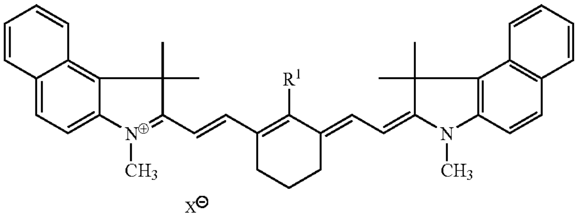
| | $R^1$ | $X^-$ | $\lambda_{max}$ (nm) |
|---|---|---|---|
| L-13 | 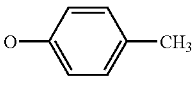 | 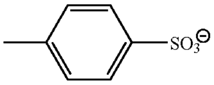 | 826 |
| L-14 | 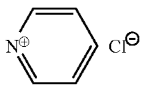 | 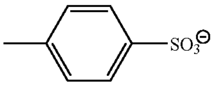 | 840 |
| L-15 | 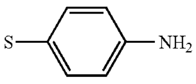 | 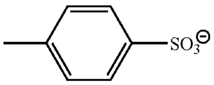 | 848 |
| L-16 | 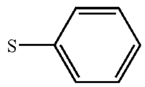 | 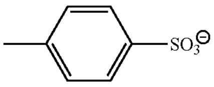 | 849 |
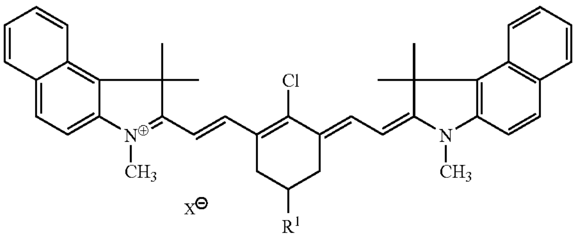
| | $R^1$ | $X^-$ | $\lambda_{max}$ (nm) |
|---|---|---|---|
| L-17 | $CH_3$ | 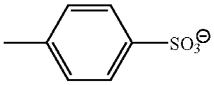 | 842 |
| L-18 | $C(CH_3)_3$ | $I^-$ | 843 |
L-19
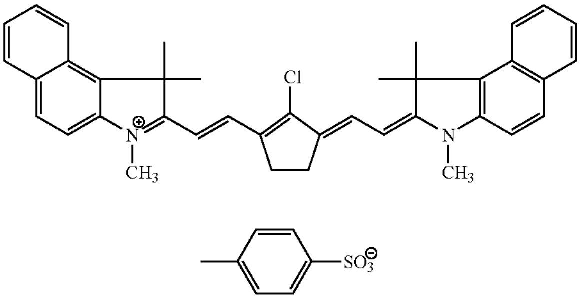
(865 nm)
L-20
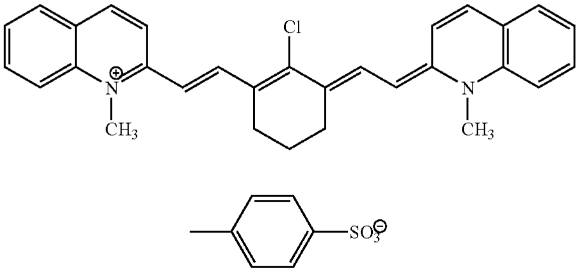
(871 nm)
L-21
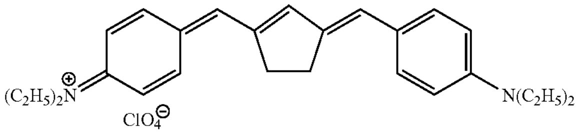
(842 nm)

-continued
L-22
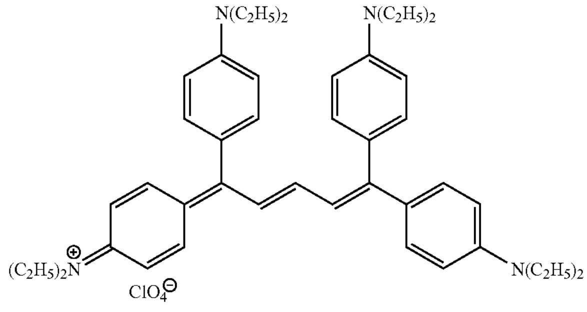
(836 nm)
L-23
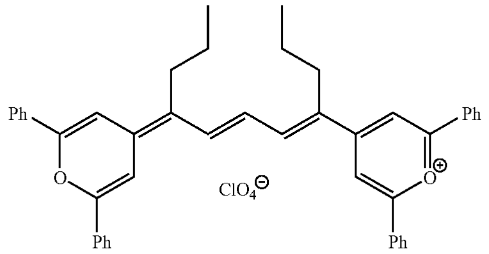
(846 nm)
L-24
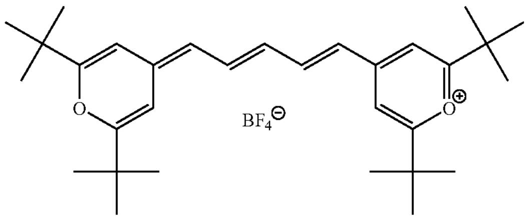
(830 nm)
L-25
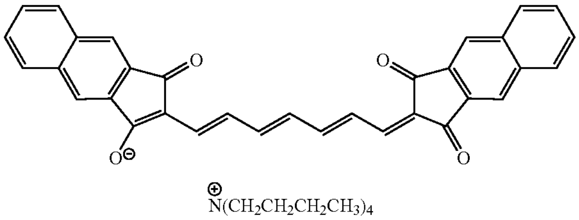
(827 nm)
L-26
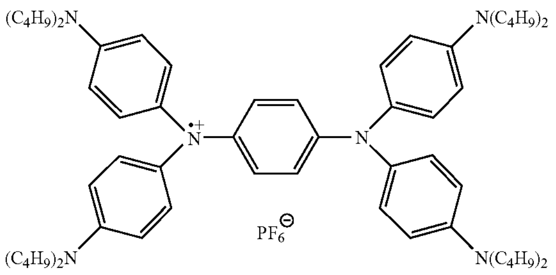
(935 nm)
-continued
L-27
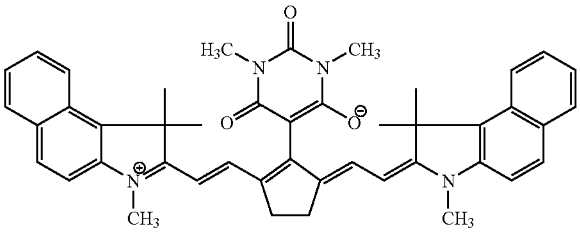
(849 nm)
L-28
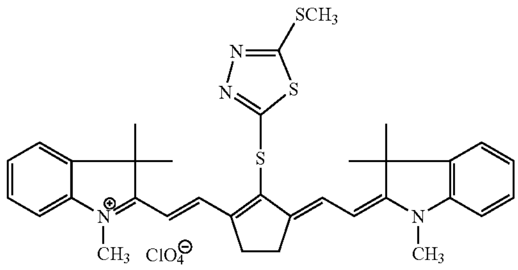
(856 nm)
L-29
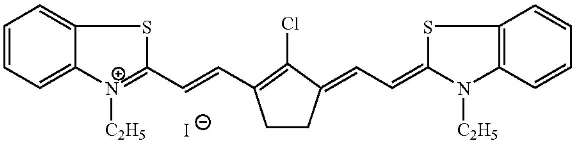
(843 nm)
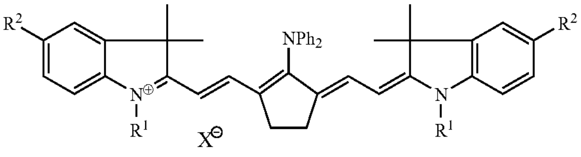
| | $R^1$ | $R^2$ | $X^-$ | $\lambda_{max}$ (nm) |
|---|---|---|---|---|
| L-30 | $CH_2CH_3$ | $CH_3$ | $CF_3SO_3^-$ | 825 |
| L-31 | $CH_2CH_3$ | $CH_3$ | $ClO_4^-$ | 825 |

L-32

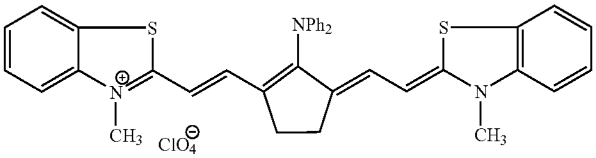

(831 nm)

L-33

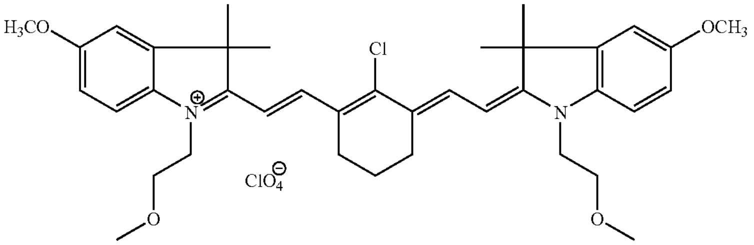

(835 nm)

Infrared Absorbing Agent Having Absorption Maximum Wavelength of Shorter Than 825 nm

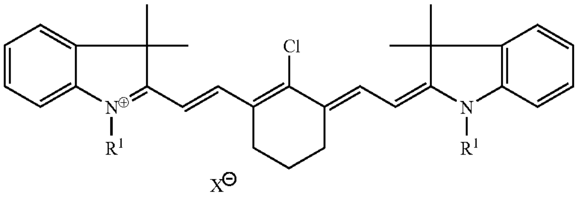

| | $R^1$ | $X^-$ | $\lambda_{max}$ (nm) |
|---|---|---|---|
| S-1 | $CH_3$ | $I^-$ | 799 |
| S-2 | $CH_3$ | $Br^-$ | 799 |
| S-3 | $CH_3$ | $Cl^-$ | 799 |
| S-4 | $CH_3$ | $ClO_4^-$ | 800 |
| S-5 | $CH_3$ | $PF_6^-$ | 800 |
| S-6 | $CH_3$ | 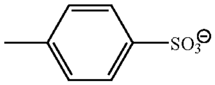 | 801 |
| S-7 | $CH_2CH_2CH_3$ | $I^-$ | 801 |
| S-8 | $CH_2(CH_2)_5CH_3$ | $I^-$ | 801 |
| S-9 | $CH_2CH_2OH$ | $ClO_4^-$ | 801 |
| S-10 | $CH_2CH_2CH_3$ | $CF_3SO_3^-$ | 800 |

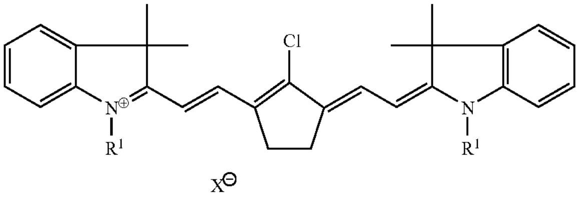

| | $R^1$ | $X^-$ | $\lambda_{max}$ (nm) |
|---|---|---|---|
| S-11 | $CH_3$ | $I^-$ | 799 |
| S-12 | $CH_3$ | $Br^-$ | 799 |
| S-13 | $CH_3$ | $Cl^-$ | 799 |
| S-14 | $CH_3$ | $ClO_4^-$ | 800 |

-continued

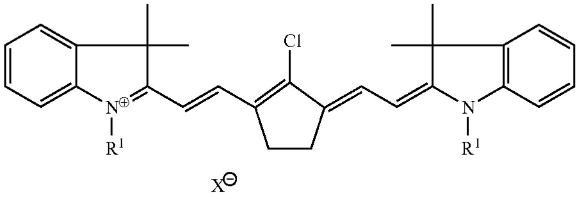

| | $R^1$ | $X^-$ | $\lambda_{max}$ (nm) |
|---|---|---|---|
| S-15 | $CH_3$ | $PF_6^-$ | 800 |
| S-16 | $CH_3$ | 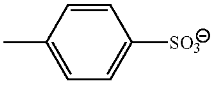 | 801 |
| S-17 | $CH_2CH_2CH_3$ | $I^-$ | 801 |
| S-18 | $CH_2(CH_2)_5CH_3$ | $I^-$ | 801 |
| S-19 | $CH_2CH_2OH$ | $ClO_4^-$ | 801 |
| S-20 | $CH_2CH_2CH_3$ | $CF_3SO_3^-$ | 800 |

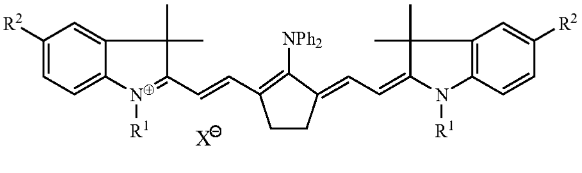

| | $R^1$ | $R^2$ | $X^-$ | $\lambda_{max}$ (nm) |
|---|---|---|---|---|
| S-21 | $CH_2CH_3$ | Cl | $CF_3SO_3^-$ | 818 |
| S-22 | $CH_2CH_3$ | Cl | $ClO_4^-$ | 818 |
| S-23 | $CH_3$ | Cl | $Cl^-$ | 817 |
| S-24 | $CH_3$ | Cl | 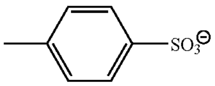 | 818 |
| S-25 | $CH_2CH_3$ | $COOC_2H_5$ | $ClO_4^-$ | 815 |
| S-26 | $CH_2CH_3$ | $CF_3$ | $ClO_4^-$ | 801 |

S-27

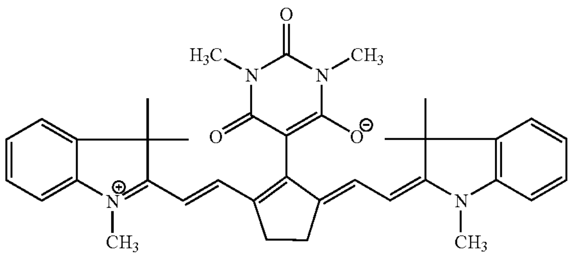

(809 nm)

S-28

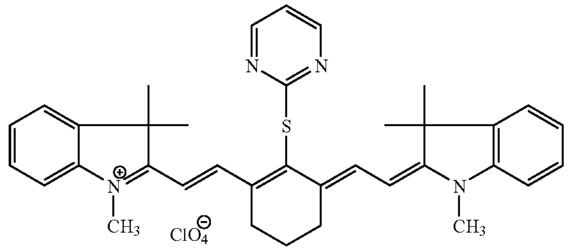

(818 nm)

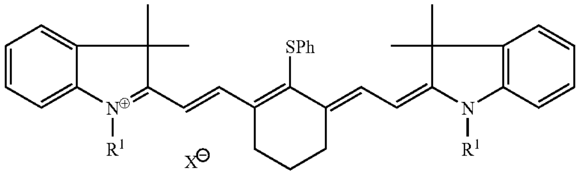

| | $R^1$ | $X^-$ | $\lambda_{max}$ (nm) |
|---|---|---|---|
| S-29 | $CH_2CH_2CH_3$ | $I^-$ | 819 |
| S-30 | $CH_2CH_3$ | $ClO_4^-$ | 819 |

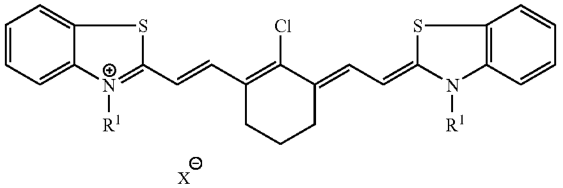

| | $R^1$ | $X^-$ | $\lambda_{max}$ (nm) |
|---|---|---|---|
| S-31 | $CH_2CH_2CH_3$ | $ClO_4^-$ | 820 |
| S-32 | $CH_2CH_3$ | $I^-$ | 820 |

With respect to an amount of the infrared absorbing agent added, the total amount of the infrared absorbing agent having an absorption maximum wavelength of not shorter than 825 and the infrared absorbing agent having an absorption maximum wavelength of shorter than 825 is preferably from 0.2 to 20% by weight, more preferably from 0.5 to 10% by weight, based on the total solid content of the second layer of the lithographic printing plate precursor according to the invention. In the above-described range of the amount added, excellent sensitivity, development latitude and preservation stability can be obtained.

A mixing weight ratio of infrared absorbing agent having an absorption maximum wavelength of not shorter than 825/infrared absorbing agent having an absorption maximum wavelength of shorter than 825 is preferably in a range of from 10/90 to 90/10, more preferably in a range of from 25/75 to 75/25, and particularly preferably in a range of from 35/65 to 60/40. Three or more kinds of the infrared absorbing agents described above may be used in combination.

[Alkali-soluble Resin]

The second layer according to the invention contains an alkali-soluble resin. The alkali-soluble resin used in the second layer must be different from an alkali-soluble resin contained as the main component in the first layer described hereinafter.

The alkali-soluble resin for use in the second layer according to the invention includes a homopolymer having an acidic group in the main chain and/or side chain thereof, a copolymer having an acidic group in the main chain and/or side chain thereof, and a mixture thereof.

Among them, polymers having acidic groups (1) to (6) described below in the main chain and/or side chain thereof are preferred in view of the solubility in an alkaline developer and the exertion of dissolution inhibiting ability.

(1) a phenol group (—Ar—OH)

(2) a sulfonamido group ($—SO_2NH—R$)

(3) an acid group of a substituted sulfonamido type (hereinafter also referred to as an "active imido group") ($—SO_2NHCOR$, $—SO_2NHSO_2R$ or $—CONHSO_2R$)

(4) a carboxylic acid group ($—CO_2H$)

(5) a sulfonic acid group ($—SO_3H$)

(6) a phosphoric acid group ($—OPO_3H_2$)

In the acidic groups (1) to (6) described above, Ar represents a divalent aryl connecting group, which may have a substituent, and R represents a hydrocarbon group, which may have a substituent.

Of the alkali-soluble resins having the acidic group selected from (1) to (6) described above, alkali-soluble resins having (1) a phenol group, (2) a sulfonamido group or (3) an active imido group are preferred and particularly, alkali-soluble resins having (1) a phenol group or (2) a sulfonamido group are most preferred from the standpoint of sufficiently obtaining the solubility in an alkaline developer, development latitude and film strength.

Examples of the alkali-soluble resin having the acidic group selected from (1) to (6) described above include the following resins.

(1) Examples of the alkali-soluble resin having a phenol group include novolak resins, for example, a condensation polymer of phenol and formaldehyde, a condensation polymer of m-cresol and formaldehyde, a condensation polymer of p-cresol and formaldehyde, a condensation polymer of m-/p-mixed cresol and formaldehyde or a condensation polymer of phenol, cresol (the cresol may be any one of m-cresol, p-cresol and m-/p-mixed cresol) and formaldehyde, and a condensation polymer of pyrogallol and acetone. Further, a copolymer obtained by copolymerization of a compound having a phenolic group in the side chain is exemplified.

Examples of the compound having a phenol group include an acrylamide, a methacrylamide, an acrylate and a methacrylate each having a phenol group, and a hydroxystyrene.

(2) Examples of the alkali-soluble resin having a sulfonamido group include a polymer containing as the main constituting component a minimum constituting unit derived from a compound having a sulfonamido group. Examples of the compound having a sulfonamido group include a compound having at least one sulfonamido group wherein at least one hydrogen atom is bonded to the nitrogen atom and at least one polymerizable unsaturated group in the molecule thereof. Among them, low-molecular compounds having both an acryloyl group, an allyl group or a vinyloxy group and a substituted or unsubstituted aminosulfonyl group or a substituted sulfonylimino group in the molecules thereof are preferred. Examples of such low-molecular compounds include compounds represented by the following formulae (i) to (v).

Formula (i)

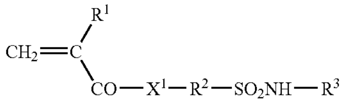

Formula (ii)

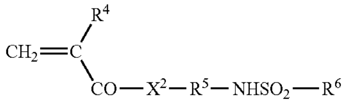

Formula (iii)

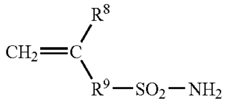

Formula (iV)

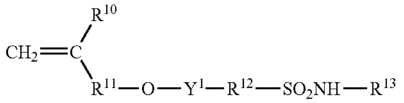

Formula (v)

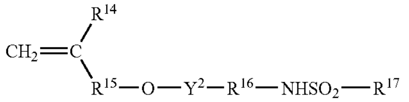

In formulae (i) to (v), $X^1$ and $X^2$ each independently represent —O— or —$NR^7$—. $R^1$ and $R^4$ each independently represent a hydrogen atom or —$CH_3$. $R^2$, $R^5$, $R^9$, $R^{12}$ and $R^{16}$ each independently represent an alkylene group having from 1 to 12 carbon atoms, a cycloalkylene group, an arylene group or an aralkylene group, each of which may have a substituent. $R^3$, $R^7$ and $R^{13}$ each independently represent a hydrogen atom or an alkyl group having from 1 to 12 carbon atoms, a cycloalkyl group, an aryl group or an aralkyl group, each of which may have a substituent. $R^6$ and $R^{17}$ each independently represent an alkyl group having from 1 to 12 carbon atoms, a cycloalkyl group, an aryl group or an aralkyl group, each of which may have a substituent. $R^8$, $R^{10}$ and $R^{14}$ each independently represent a hydrogen atom or $CH_3$. $R^{11}$ and $R^{15}$ each independently represent a single bond or an alkylene group having from 1 to 12 carbon atoms, a cycloalkylene group, an arylene group or an aralkylene group, each of which may have a substituent. $Y^1$ and $Y^2$ each independently represent a single bond or —C(=O)—.

Particularly, of the compounds represented by formulae (i) to (v), for example, m-aminosulfonylphenyl methacrylate, N-(p-aminosulfonylphenyl)methacrylamide and N-(p-aminosulfonylphenyl)acrylamide are preferably used in the lithographic printing plate precursor of the invention.

(3) Examples of the alkali-soluble resin having an active imido group include a polymer containing as the main constituting component a minimum constituting unit derived from a compound having an active imido group. Examples of the compound having an active imido group include a compound having at least one active imido group represented by the structure shown below and at least one polymerizable unsaturated group in the molecule thereof.

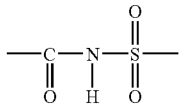

Specifically, for example, N-(p-toluenesulfonyl)methacrylamide and N-(p-toluenesulfonyl)acrylamide are preferably used.

(4) Examples of the alkali-soluble resin having a carboxylic acid group include a polymer containing as the main constituting component a minimum constituting unit derived from a compound having a carboxylic acid group and at least one polymerizable unsaturated group in the molecule thereof.

(5) Examples of the alkali-soluble resin having a sulfonic acid group include a polymer containing as the main constituting component a minimum constituting unit derived from a compound having a sulfonic acid group and at least one polymerizable unsaturated group in the molecule thereof.

(6) Examples of the alkali-soluble resin having a phosphoric acid group include a polymer containing as the main constituting component a minimum constituting unit derived from a compound having a phosphoric acid group and at least one polymerizable unsaturated group in the molecule thereof.

It is not necessary to use only one kind of the minimum constituting units having the acidic group selected from (1) to (6) described above, which constitutes the alkali-soluble resin for use in the image-forming layer, and a copolymer obtained by copolymerization of two or more minimum constituting units having the same acidic group or a copolymer obtained by copolymerization of two or more minimum constituting units having different acidic groups may be used.

In the copolymer described above, a content of the compound having the acidic group selected from (1) to (6) for copolymerization is preferably not less than 10 mol %, and more preferably not less than 20 mol % in the copolymer. In the case where the content of the monomer is not less than 10 mol %, the development latitude can be sufficiently improved.

When the alkali-soluble resin for use in the invention is a copolymer obtained by copolymerization, a compound not having the acidic group selected from (1) to (6) described above may be used as a compound copolymerized with the compound having the acidic group. Examples of the compound not having the acidic group selected from (1) to (6) include compounds illustrated in (m1) to (m12) described below, but the compound should not be construed as being limited thereto.

(m1) acrylates and methacrylates each having an aliphatic hydroxy group, for example, 2-hydroxyethyl acrylate or 2-hydroxyethyl methacrylate;

(m2) alkyl acrylates, for example, methyl acrylate, ethyl acrylate, propyl acrylate, butyl acrylate, amyl acrylate, hexyl acrylate, octyl acrylate, benzyl acrylate, 2-chloroethyl acrylate or glycidyl acrylate;

(m3)alkyl methacrylates, for example, methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate or glycidyl methacrylate;

(m4) acrylamides or methacrylamides, for example, acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide or N-ethyl-N-phenylacrylamide;

(m5) vinyl ethers, for example, ethyl vinyl ether, 2-chloroethyl vinyl ether, hydroxyethyl vinyl ether, propyl vinyl ether, butyl vinyl ether, octyl vinyl ether or phenyl vinyl ether;

(m6) vinyl esters, for example, vinyl acetate, vinyl chloroacetate, vinyl butyrate or vinyl benzoate;

(m7) styrenes, for example, styrene, α-methylstyrene, methylstyrene or chloromethylstyrene;

(m8) vinyl ketones, for example, methyl vinyl ketone, ethyl vinyl ketone, propyl vinyl ketone or phenyl vinyl ketone;

(m9) olefins, for example, ethylene, propylene, isobutylene, butadiene or isoprene;

(m10)N-vinylpyrrolidone, acrylonitrile or methacrylonitrile;

(m11)unsaturated imides, for example, maleimide, N-acryloylacrylamide, N-acetylmethacrylamide, N-propionylmethacrylamide or N-(p-chlorobenzoyl)methacrylamide;

(m12)unsaturated carboxylic acids, for example, acrylic acid, methacrylic acid, maleic anhydride and itaconic acid.

The alkali-soluble resin having a weight average molecular weight of not less than 500 is preferred in view of the image-forming property. More preferably, the weight average molecular weight is from 1,000 to 700,000. A number average molecular weight of the alkali-soluble resin is preferably not less than 500. More preferably, the number average molecular weight is from 750 to 650,000. A degree of dispersion (weight average molecular weight/number average molecular weight) is preferably from 1.1 to 10.

The alkali-soluble resins may be used not only individually but also in combination of two or more thereof.

When the alkali-soluble resins are used in combination, a condensation polymer of a phenol containing an alkyl group having from 3 to 8 carbon atoms as a substituent and formaldehyde, for example, a condensation polymer of tert-butylphenol and formaldehyde or a condensation polymer of octylphenol and formaldehyde described in U.S. Pat. No. 4,123,279, and an alkali-soluble resin containing a phenol structure having an electron withdrawing group on the aromatic ring thereof described in JP-A-2000-241972 proposed by the present inventors may be used together.

The alkali-soluble resin for use in the second layer (upper image-forming layer) is preferably a polymer compound having a phenolic hydroxy group because of the improvement in image-forming property resulting from the properties that strong hydrogen bonds are formed in the unexposed area but the hydrogen bonds are partially resolved easily in the exposed area and that the difference of developability between the unexposed area and the exposed area is large with respect to a non-silicate developer. A novolak resin is more preferably used.

With respect to the alkali-soluble resin for use in the second layer, the total content thereof is preferably from 30 to 98% by weight, and more preferably from 40 to 95% by weight based on the total solid content of the second layer. When the content of the alkali-soluble resin is not less than 30% by weight, the preferable durability can be obtained. When the content of the alkali-soluble resin is not more than 98% by weight, the sufficient sensitivity and image-forming property can be obtained.

[Other Components]

In the preparation of the second later, various additives can be added, if desired. For instance, it is preferred to use a substance, which is thermally decomposable and can substantially decrease the solubility of the alkali-soluble resin before being thermally decomposed, for example, an onium salt, an o-quinonediazide compound, an aromatic sulfone compound or an aromatic sulfonic acid ester compound for the purpose of improving the dissolution inhibiting property of the image area in a developer. Examples of the onium salt include a diazonium salt, an ammonium salt, a phosphonium salt, an iodonium salt, a sulfonium salt, a selenonium salt and an arsonium salt.

Preferred examples of the onium salt for use in the invention include diazonium salts described in S. I. Schlesinger, *Photogr. Sci. Eng.,* 18, 387 (1974), T. S. Bal et al., *Polymer,* 21, 423 (1980), and JP-A-5-158230, ammonium salts described in U.S. Pat. Nos. 4,069,055 and 4,069,056, and JP-A-3-140140, phosphonium salts described in D. C. Necker et al., *Macromolecules,* 17, 2468 (1984), C. S. Wen et al., *Teh, Proc. Conf. Rad. Curing ASIA*, p. 478, Tokyo, Oct. (1988), and U.S. Pat. Nos. 4,069,055 and 4,069,056, iodonium salts described in J. V. Crivello et al., *Macromolecules,* 10 (6), 1307 (1977), *Chem. & Eng. News*, November 28, p. 31 (1988), European Patent 104,143, U.S. Pat. Nos. 5,041,358 and 4,491,628, JP-A-2-150848 and JP-A-2-296514, sulfonium salts described in J. V. Crivello et al., *Polymer J.,* 17, 73 (1985), J. V. Crivello et al., *J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci., Polymer Chem. Ed.,* 17, 2877 (1979), European Patents 370,693, 233, 567, 297,443 and 297,442, U.S. Pat. Nos. 4,933,377, 3,902,114, 4,491,628, 5,041,358, 4,760,013, 4,734,444 and 2,833,827, and German Patents 2,904,626, 3,604,580 and 3,604,581, selenonium salts described in J. V. Crivello et al., *Macromolecules,* 10 (6), 1307 (1977), and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA*, p. 478, Tokyo, Oct. (1988).

Among the onium salts, diazonium salts are preferred. Particularly preferred examples of the diazonium salt include those described in JP-A-5-158230.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and para-toluenesulfonic acid. Among these compounds, hexafluorophosphoric acid and an alkylaromatic sulfonic acid, for example, triisopropylnaphthalenesulfonic acid or 2,5-dimethylbenzenesulfonic acid are preferred.

Preferred examples of the quinonediazide include o-quinonediazide compounds. The o-quinonediazide compound for use in the invention is a compound having at least one o-quinonediazido group, which increases the alkali solubility upon thermal decomposition, and compounds having various structures can be used. In other words, o-quinonediazide assists dissolution of the photosensitive system by its two effects, that is, the o-quinonediazide loses the dissolution inhibiting ability to the binder upon thermal decomposition and the o-quinonediazide itself changes into an alkali-soluble substance. Examples of the o-quinonediazide compound, which can be used in the invention, include compounds described in J. Kosar, *Light-Sensitive Systems*, pages 339 to 352, John Wiley & Sons, Inc. In particular, sulfonic acid esters or sulfonic acid amides of o-quinonediazide, obtained by reacting with various aromatic polyhydroxy compounds or aromatic amino compounds, are preferred. Also, ester of benzoquinone-(1,2)-diazidosulfonic chloride or naphthoquinone-(1,2)-diazido-5-sulfonic chloride with a pyrogallol-acetone resin described in JP-B-43-28403, and ester of benzoquinone-(1,2)-diazidosulfonic chloride or naphthoquinone-(1,2)-diazido-5-sulfonic chloride with a phenol-formaldehyde resin described in U.S. Pat. Nos. 3,046,120 and 3,188,210 are preferably used.

Furthermore, an ester of naphthoquinone-(1,2)-diazido-4-sulfonic chloride with a phenol-formaldehyde resin or cresol-formaldehyde resin, and an ester of naphthoquinone-(1,2)-diazido-4-sulfonic chloride with a pyrogallol-acetone resin are also preferably used. Other useful o-quinonediazide compounds are described in a large number of patents, for example, JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890.

The amount of the o-quinonediazide compound added is preferably from 0 to 10% by weight, more preferably from 0 to 5% by weight, and particularly preferably from 0 to 2% by weight, based on the total solid content of the image-forming layer. The o-quinonediazide compounds may be used individually or as a mixture of a plurality of the compounds.

The amount of the additive other than the o-quinonediazide compound is preferably from 0 to 5% by weight, more preferably from 0 to 2% by weight, and particularly preferably from 0.1 to 1.5% by weight.

For the purpose of further increasing the sensitivity, a cyclic acid anhydride, a phenol or an organic acid may be used together. Examples of the cyclic acid anhydride, which can be used, include phthalic anhydride, tetrahydro-phthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Examples of the phenol include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. Examples of the organic acid include sulfonic acids, sulfinic acids, alkylsulfuric acids, phosphonic acids, phosphoric acid esters and carboxylic acids described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. The content of the cyclic acid anhydride, phenol or organic acid in the image-forming layer is preferably from 0.05 to 20% by weight, more preferably from 0.1 to 15% by weight, and particularly preferably from 0.1 to 10% by weight based on the total solid content of the layer.

In addition, for enhancing the stability of processing to development conditions, a coating solution for image-forming layer for use in the invention may contain a nonionic surfactant described in JP-A-62-251740 and JP-A-3-208514, an amphoteric surfactant described in JP-A-59-121044 and JP-A-4-13149, a siloxane compound described in European Patent 950,517, or a copolymer of a fluorine-containing monomer described in JP-A-11-288093.

Specific examples of the nonionic surfactant include sorbitan tristearate, sorbitan monopalmitate, sorbitan trioleate, stearic acid monoglyceride and polyoxyethylene nonylphenyl ether. Specific examples of the amphoteric surfactant include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type (e.g., Amorgen K, trade name, manufactured by Dai-ich Kogyo Seiyaku Co., Ltd.).

The siloxane compound is preferably a block copolymer of dimethylsiloxane and polyalkylene oxide. Specific examples thereof include polyalkylene oxide-modified silicones, e.g., DBE-224, DBE-621, DBE-712, DBP-732, DBP-534 (all manufactured by Chisso Corp.) and Tego Glide 100 (manufactured by Tego A. G.).

The content of the nonionic surfactant or amphoteric surfactant is preferably from 0.05 to 15% by weight, and more preferably from 0.1 to 5% by weight based on the total solid content of the second layer.

The image-forming layer according to the invention may contain a printing-out agent for obtaining a visible image immediately after the heating upon exposure, or a dye or pigment serving as an image-coloring agent.

A representative example of the printing-out agent includes a combination of a compound capable of releasing an acid under the heating upon exposure (photo-acid releasing agent) and an organic dye capable of forming a salt. Specific examples thereof include a combination of o-naphthoquinonediazido-4-sulfonic acid halogenide and a salt-forming organic dye described in JP-A-50-36209 and JP-A-53-8128, and a combination of a trihalomethyl compound and a salt-forming organic dye described in JP-A-53-36223, JP-A-54-74728, JP-A-60-3626, JP-A-61-143748, JP-A-61-151644 and JP-A-63-58440. The trihalomethyl compound includes an oxazole compound and a triazine compound, and both compounds have excellent storage stability and provide a clear print-out image.

Examples of the image-coloring agent, which can be used, include the above-described salt-forming organic dyes and other dyes. Preferred dyes include an oil-soluble dye and a basic dye, as well as the salt-forming organic dye. Specific examples thereof include Oil Yellow #101, Oil Yellow #103, Oil Ping #312, Oil Green BG, Oil Blue BOS, Oil Blue #603, Oil Black BY, Oil Black BS, Oil Black T-505 (all manufactured by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000) and Methylene Blue (CI52015). Dyes described in JP-A-62-293247 are particularly preferred. The dye can be added in an amount of from 0.01 to 10% by weight, and preferably from 0.1 to 3% by weight based on the total solid content of the second layer. Further, to the second layer according to the invention, a plasticizer is added, if desired, so as to impart flexibility or the like to the coating film.

Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers or polymers of acrylic acid or methacrylic acid.

Besides the additives described above, an epoxy compound, a vinyl ether, a phenol compound having a hydroxymethyl group or a phenol compound having an alkoxymethyl group described in JP-A-8-276558, and a cross-likable compound having an alkali dissolution inhibiting function described in JP-A-11-160860 proposed by the present inventors may be appropriately used depending on the purpose.

[First Layer]

The first layer (lower image-forming layer) according to the invention is a layer provided between the second layer (upper image-forming layer) described above and a support. The first layer must contain as the main component an alkali-soluble resin.

As the alkali-soluble resin contained as the main component in the first layer, the alkali-soluble resin for use in the second layer can be employed. As described above, however, the alkali-soluble resin used in the first layer must be different from the alkali-soluble resin for use in the second layer.

As long as the condition described above is fulfilled, the alkali-soluble resins contained as the main component in the first layer may be used not only individually but also in combination of two or more thereof.

The alkali-soluble resin used in the first layer includes a resin, for example, an acryl resin, a urethane resin or a butyral resin. From the viewpoint of well maintaining the solubility of the first layer in an alkali developer, an alkali-soluble resin containing an acid group having pKa of not higher than 12 is preferred. In view of ease of the introduction of such an acid group and the image-forming property at the development, an acryl resin and a urethane resin each containing an acid group having pKa of not higher than 12 is more preferred, and the acryl resin is particularly preferred. Further, from the standpoint of restraining the mixture of the first layer and the second layer, it is preferred that the alkali-soluble resin has a highly polar structure, for example, a sulfonamido, amido, urethane or imido structure. Among them, particularly preferred examples thereof include a copolymer containing a monomer unit having a sulfonamido group described in JP-A-61-275838, JP-A-4-204448, JP-A-11-269229, JP-A-2002-228626 and a copolymer containing N-phenylmaleimide and methacrylamide as monomer units described in U.S. Pat. No. 6,358,669.

With respect to the alkali-soluble resin for use in the first layer, the total content thereof is preferably from 30 to 99% by weight, and more preferably from 40 to 95% by weight based on the total solid content of the first layer.

In the preparation of the first later, various additives can further be used, if desired. Examples of the additives include infrared absorbing agents described above, heat-decomposable compounds, surfactants, coloring dyes, a variety of film forming polymer compounds as represented by an alkali-soluble resin compound, cyclic anhydrides, phenols and organic acids. The details thereof are described in the additives for the second layer described above. Each of the additives for use in the second layer described above can also be employed in the first layer. In particular, it is preferred to add the above-described infrared absorbing agent to the first layer since the image-forming property is provided to the first layer thereby improving the image quality of the lithographic printing plate precursor.

[Support]

The support for use in the invention is not particularly restricted as long as a dimensionally stable plate material satisfying necessary physical properties, for example, strength and flexibility. Examples of the support include paper, paper laminated with plastic (for example, polyethylene, propylene or polystyrene), a metal plate (for example, an aluminum, zinc or copper plate), a plastic film (for example, a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film), and paper or plastic film having laminated or deposited thereon the metal described above.

The support for use in the invention is preferably a polyester film or an aluminum plate. Among them, the aluminum plate is particularly preferred, since it is dimensionally stable and relatively inexpensive. The aluminum plate is preferably a pure aluminum plate or an alloy plate mainly comprising aluminum and containing a trace amount of foreign element. A plastic film having laminated or deposited thereon aluminum may also be used. Examples of the foreign element contained in the aluminum alloy include silicon, iron, manganese, copper, magnesium, chromium, zinc, bismuth, nickel and titanium. The content of foreign element in the alloy is at most 10% by weight. In the invention, particularly preferred aluminum is pure aluminum but since perfectly pure aluminum is difficult to produce in view of the refining technique, the aluminum may contain a trace amount of foreign element.

The aluminum plate for use in the invention is not particularly limited on the composition and an aluminum plate conventionally known and commonly used can be appropriately used. The thickness of the aluminum plate for use in the invention is approximately from 0.1 to 0.6 mm, preferably from 0.15 to 0.4 mm, and particularly preferably from 0.2 to 0.3 mm.

Prior to surface roughening of an aluminum plate, a degreasing treatment using, for example, a surfactant, an organic solvent or an aqueous alkaline solution is performed, if desired, in order to remove the rolling oil on the surface. The surface roughening treatment of the aluminum plate is performed by various methods, for example, by a method of mechanically roughening the surface, a method of electrochemically dissolving and roughening the surface or a method of chemically dissolving selectively the surface. In the mechanical roughening method, a known method, for example, a ball graining method, a brush graining method, a blast graining method or a buff graining method may be used. The electrochemical surface roughening method includes a method of performing the treatment by applying an alternating current or direct current through an electrolytic solution containing hydrochloric acid or nitric acid. A method using both treatments in combination described in JP-A-54-63902 may also be used. After such surface roughening, the aluminum plate is, if desired, subjected to an alkali etching treatment and a neutralization treatment and then, if desired, to an anodization treatment so as to enhance the water retentivity or abrasion resistance on the surface. The electrolyte, which can be used in the anodization treatment of the aluminum plate, includes various electrolytes capable of forming a porous oxide film, and sulfuric acid, phosphoric acid, oxalic acid, chromic acid or a mixed acid thereof is ordinarily used. The concentration of the electrolyte is appropriately determined depending on the kind of electrolyte.

The conditions of anodization treatment vary depending on the electrolyte used and therefore, cannot be indiscriminately specified, however, suitable conditions are ordinarily such that the concentration of electrolyte is from 1 to 80% by weight, the solution temperature is from 5 to 70° C., the current density is from 5 to 60 $A/dm^2$, the voltage is from 1 to 100 V, and the electrolysis time is from 10 seconds to 5 minutes. When the amount of anodic oxide film is less than 1.0 $g/m^2$, insufficient printing durability may result or the non-image area of lithographic printing plate is readily scratched to cause so-called "scratch stain", namely, adhesion of ink to the scratched part at the printing. After the anodization treatment, the aluminum surface is, if desired, subjected to a hydrophilization treatment. Examples of the hydrophilization treatment for use in the invention include a method of using an alkali metal silicate (for example, an aqueous sodium silicate solution) described in U.S. Pat. Nos. 2,714,066, 3,181,461, 3,280,734 and 3,902,734. According to the method, the support is immersed or electrolyzed in an aqueous sodium silicate solution. Further, a method of treating the support with potassium fluorozirconate described in JP-B-36-22063 or with polyvinylphosphonic acid described in U.S. Pat. Nos. 3,276,868, 4,153,461 and 4,689,272 may be used.

The lithographic printing plate precursor of the invention comprises the first layer described above and the second layer described above in this order on the support but, if desired, an undercoat layer may be provided between the first layer and the support.

For components of the undercoat layer, various organic compounds are used and examples thereof include carboxymethyl cellulose; dextrin; gum arabic; phosphonic acids having an amino group, e.g., 2-aminoethylphosphonic acid; organic phosphonic acids, e.g., phenylphosphonic acid, naphthylphosphonic acid, alkyl phosphonic acid, glycerophosphonic acid, methylenediphosphonic acid and ethylenediphosphonic acid, each of which may have a substituent; organic phosphoric acids, e.g., phenylphosphoric acid, naphthylphosphoric acid, alkylphosphoric acid and glycerophosphoric acid, each of which may have a substituent; organic phosphinic acids, e.g., phenylphosphinic acid, naphthylphosphinic acid, alkylphosphinic acid and glycerophosphinic acid, each of which may have a substituent; amino acids, e.g., glycine and β-alanine; and hydrochlorides of amines having a hydroxy group, e.g., hydrochloride of triethanolamine. The compounds may be used as a mixture of two or more thereof.

The organic undercoat layer can be provided by the following methods. Specifically, there are a method of dissolving the above-described organic compound in water, an organic solvent, e.g., methanol, ethanol or methyl ethyl ketone, or a mixed solvent thereof, coating the resulting solution on an aluminum plate and drying it to provide the organic undercoat layer, and a method of dissolving the organic compound in water, an organic solvent, e.g., methanol, ethanol or methyl ethyl ketone, or a mixed solvent thereof, immersing an aluminum plate in the resulting solution to adsorb the compound, washing the aluminum plate with water or the like, and drying it to provide the organic undercoat layer. In the former method, the solution containing the organic compound in a concentration of 0.005 to 10% by weight can be coated by various methods. In the latter method, the concentration of the solution is from 0.01 to 20% by weight, preferably from 0.05 to 5% by weight, the immersion temperature is from 20 to 90° C., preferably from 25 to 50° C., and the immersion time is from 0.1 second to 20 minutes, preferably from 2 seconds to 1 minute. The solution used may also be adjusted its pH to a range of from 1 to 12 with a basic substance, for example, ammonia, triethylamine or potassium hydroxide or an acidic substance, for example, hydrochloric acid or phosphoric acid. Moreover, a yellow dye may be added to the solution in order to improve the tone reproducibility of the lithographic printing plate precursor.

The coverage of the organic undercoat layer is suitably from 2 to 200 $mg/m^2$, and preferably from 5 to 100 $mg/m^2$. By controlling the coverage of the organic undercoat layer in the range described above, sufficiently high printing durability can be obtained.

[Preparation of Lithographic Printing Plate Precursor]

The image-forming layer (the first layer and the second layer) of the lithographic printing plate precursor according to the invention can be ordinarily formed by dissolving the components in a solvent and coating the resulting solution on a support.

Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene, however, the solvent should not be construed as being limited thereto. The solvents may be used individually or as a mixture thereof.

The solvent used for coating is preferably selected such that its solubility of the alkali-soluble resin used in the first layer is different from its solubility of the alkali-soluble resin used in the second layer. More specifically, when the first layer is coated and then the second layer is coated adjacently thereto as the upper layer, if a solvent capable of dissolving the alkali-soluble resin of the first layer is used as the solvent for coating of the second layer, the mixing at the interface between the layers cannot be neglected and at the extreme, a uniform single layer is formed without forming multiple layers. If two adjacent layers are mixed at the interface or mingled with each other to show a behavior like a uniform layer, the effect of the invention obtained by having two layers is disadvantageously impaired. Accordingly, the solvent used for coating of the second layer is preferably a poor solvent for the alkali-soluble resin contained in the first layer.

In the solution used for coating of each layer, the concentration of the above-described components (total solid content including additives) is preferably from 1 to 50% by weight.

The coated amount (solid basis) of each layer on the support, after coating and drying, may vary depending on the use but is preferably from 0.02 to 1.5 $g/m^2$ for the second layer and from 0.2 to 3.0 $g/m^2$ for the first layer. When the coated amount of second layer is not less than 0.02 $g/m^2$, the satisfactory image-forming property is obtained, whereas when the coated amount of second layer is not more than 1.5 $g/m^2$, the favorable sensitivity is obtained. When the coated amount of the first layer is controlled within the above-described range, the satisfactory image-forming property is obtained.

The total coated amount of the first layer and the second layer is preferably from 0.5 to 3.0 $g/m^2$. When the total coated amount is not less than 0.5 $g/m^2$, the satisfactory film property is obtained, whereas when the total coated amount is not more than 3.0 g/$m^2$, the favorable sensitivity is maintained. As the coated amount is smaller, the apparent sensitivity becomes higher but the film property of the image-forming layer is more reduced in some cases.

For the coating, various methods can be used and examples thereof include bar coater coating, spin coating, spray coating, curtain coating, dip coating, air knife coating, blade coating and roll coating.

The image-forming layer (the first layer and the second layer) used in the invention may contain a surfactant for improving the coatability and examples of the surfactant include fluorine-containing surfactants described in JP-A-62-170950. The amount of the surfactant added is preferably from 0.01 to 1% by weight, and more preferably from 0.05 to 0.5% by weight based on the total solid content of the image-forming layer.

[Plate-making and Printing]

The lithographic printing plate precursor according to the invention is ordinarily subjected to image exposure and development processing to use for printing.

As a light source of light for use in the image exposure, a light source having an emission wavelength in the region from near infrared to infrared is preferred, and a solid laser or a semiconductor laser is particularly preferred.

As a developer and its replenisher used in the development of the lithographic printing plate precursor of the invention, a conventionally known aqueous alkali solution containing an alkali agent can be employed.

Examples of the alkali agent include an inorganic alkali salt, for example, sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide or lithium hydroxide. Also, an organic alkali agent, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine can be used. The alkali agents can be used individually or in combination of two or more thereof.

Of the developers containing the alkali agent, an aqueous solution of silicate, for example, sodium silicate or potassium silicate is particularly preferred. The reason for this is that the developability can be controlled by appropriately adjusting a ratio between silicon oxide ($SiO_2$) and alkali metal oxide ($M_2O$) as constituents of the silicate and concentration of the silicate. For instance, alkali metal silicates described in JP-A-54-62004 and JP-B-57-7427 can be effectively used.

It is known that in the case of performing the development using an automatic developing machine, by adding an aqueous solution (replenisher) having higher alkalinity than the developer is added to the developer, a large amount of pre-sensitized lithographic printing plates can be processed without exchanging the developer in the development tank for a long period of time. In the invention, such a replenishing system is also preferably used. In the developer and the replenisher, a variety of surfactants and organic solvents may be added, if desired, for the purpose of accelerating or inhibiting the development, dispersing the development scum, or enhancing the ink-receptivity of the image area of printing plate.

Preferred examples of the surfactant include anionic, cationic, nonionic and amphoteric surfactants. Furthermore, the developer or replenisher may contain, if desired, a reducing agent, for example, hydroquinone, resorcin or a sodium salt or potassium salt of an inorganic acid (e.g., sulfurous acid, hydrogen sulfurous acid), an organic carboxylic acid, a defoaming agent and a water softening agent.

The lithographic printing plate precursor developed using the above-described developer and replenisher is subjected to an after-treatment with washing water, a rinsing solution containing a surfactant and the like, or a desensitizing solution containing gum arabic or a starch derivative. These treatments can be used in various combinations for the after-treatment of the lithographic printing plate precursor of the invention.

In recent years, an automatic developing machine for printing plates has been widely used in the plate-making and printing industry so as to rationalize and standardize the plate-making operation. In general, the automatic developing machine has a developing part and an after-treatment part and comprises a device for conveying a printing plate precursor, and tanks for respective processing solutions and spraying devices. In the development processing, each processing solution pumped up by a pump is sprayed through spray nozzles to the exposed printing plate precursor while horizontally conveying the printing plate precursor. In recent years, a method of processing a printing plate precursor by immersing the printing plate precursor in processing solution bathes each filled with a processing solution while conveying the printing plate precursor by means of guide rollers in the solution is also known. In such automatic processing, the processing can be performed while replenishing the replenisher to each processing solution in accordance with the amount of processing, the operating time or the like. Furthermore, a so-called disposable processing system of performing the processing using a substantially fresh processing solution can also be employed.

In the case where a lithographic printing plate obtained from the lithographic printing plate precursor of the invention through image exposure, development, water washing and/or rinsing and/or gumming has an unnecessary image area (for example, film edge mark of an original film), elimination of the unnecessary image area is carried out. Such elimination is preferably performed by method described, for example, in JP-B-2-13293, where a eliminating solution is applied to the unnecessary image area, allowed to stand for a predetermined time and thereafter, washed with water. However, method described in JP-A-59-174842, where the unnecessary image area is irradiated with an active beam guided by an optical fiber and then subjected to development is also utilized.

The thus-obtained lithographic printing plate is, if desired, coated with a desensitizing gum and then can be used for printing. However, when a lithographic printing plate having higher printing durability is desired, the printing plate is subjected to a baking treatment. In the lithographic printing plate precursor of the invention, since each of the first layer and the second layer is heat-crosslinkable, the printing durability is remarkably improved by subjecting it to a conventional baking treatment.

In the case of baking the lithographic printing plate, the plate before the baking is preferably treated with a plate baking conditioner described, for example, in JP-B-61-2518, JP-B-55-28062, JP-A-62-31859 and JP-A-61-159655.

The treatment may be performed by a method of applying the plate baking conditioner on the lithographic printing plate using a sponge or an absorbent cotton impregnated with the plate baking conditioner, a method of applying the plate baking conditioner by immersing the printing plate in a vat filled with the plate baking conditioner, or a method of applying the plate baking conditioner using an automatic coater. When the amount of plate baking conditioner applied is made uniform by a squeegee or a squeegee roller after the application, more preferred results can be obtained.

An amount of the plate baking conditioner applied is ordinarily from 0.03 to 0.8 g/$m^2$ (dry weight). The lithographic printing plate applied with the plate baking conditioner is dried, if desired, and then heated at a high temperature by a baking processor (for example, burning processor "BP-1300" commercially available from Fuji Photo Film Co., Ltd.). The heating temperature and the heating time are preferably from 180 to 300° C. and from 1 to 20 minutes, respectively, though these may be varied depending on the components constituting the image.

The lithographic printing plate after the baking treatment can be subjected, if desired, to conventional treatment, for example, water washing and gumming, however, in the case where a plate baking conditioner containing a water-soluble polymer compound or the like is used, a so-called desensitizing treatment, for example, gumming can be omitted. The lithographic printing plate obtained through such treatments is mounted on an offset printing machine and used for printing of a large number of sheets.

The invention will be described in greater detail with reference to the following examples, but the invention should not be construed as being limited thereto.

(Preparation of Support)

An aluminum plate of JIS A1050 having a thickness of 0.3 mm was treated with a combination of the steps described below to prepare Supports A, B, C and D.

(a) Mechanical Graining Treatment

While supplying a suspension of abrasives (silica sand) in water having a specific gravity of 1.12 to the surface of the aluminum plate as an abrasive slurry, mechanical graining was carried out using rotating roller-form nylon brushes. The mean grain size of the abrasives was 8 μm and the maximum grain size thereof was 50 μm. The material of bristle of the nylon brush was Nylon 6, 10, the length of the bristle was 50 mm, and the diameter of the bristle was 0.3 mm. The nylon brush was prepared by making many holes in the wall of a stainless steel-made cylinder having a diameter of 300 mm and bristles were planted in the holes closely. Three rotary brushes were used. The distance of two supporting rollers (diameter of 200 mm) under the brushes was 300 mm. The brushes pressed the aluminum plate by the brush rollers until the load of a driving motor rotating the brushes became 7 kW plus to the load before pressing the aluminum plate by the brush rollers. The rotating direction of the brushes was same as the moving direction of the aluminum plate. The rotation number of the brushes was 200 rpm.

(b) Alkali Etching Treatment

The aluminum plate treated as described above was subjected to an etching treatment by splaying an aqueous sodium hydroxide solution (sodium hydroxide concentration: 26% by weight; aluminum ion concentration: 6.5% by weight) having a temperature of 70° C. to dissolve 6 g/$m^2$ of the aluminum plate. Thereafter, water washing was carried out by spraying well water.

(c) Desmut Treatment

A desmat treatment was carried out by spraying an aqueous solution having a nitric acid concentration of 1% by weight (containing 0.5% by weight of aluminum ion) having a temperature of 30° C., and thereafter the aluminum plate was water washed by spraying. As the aqueous nitric acid solution used in the desmut treatment, waste liquid from the following step of carrying out electrochemical graining using alternating current in an aqueous nitric acid solution was employed.

(d) Electrochemical Graining Treatment

Using an alternating current of 60 Hz, an electrochemical graining treatment was continuously carried out. The electrolyte used was an aqueous solution of 10.5 g/liter of nitric acid (containing 5 g/liter of aluminum ion) and the temperature was 50° C. The electrochemical graining treatment was conducted using an alternating current source which provides a trapezoidal rectangular wave alternating current of 0.8 msec in time TP for the current to reach its peak from zero and 1:1 in duty ratio and using a carbon electrode as a counter electrode. A ferrite was used as an auxiliary anode. As an electrolysis vessel, a radial cell type was used.

The current density was 30 A/$dm^2$ in the peak value of the electric current and the quantity of electricity was 220 C/$dm^2$ in terms of the total quantity of electricity during the aluminum plate functioning as an anode. To the auxiliary electrode, 5% of the electric current from the electric source was provided.

Thereafter, water washing was carried out by spraying well water.

(e) Alkali Etching Treatment

The aluminum plate was subjected to an etching treatment by spraying an aqueous solution having a sodium hydroxide concentration of 26% by weight and an aluminum ion concentration of 6.5% by weight at 32° C. to dissolve 0.20 g/$m^2$ of the aluminum plate, whereby the smut components mainly composed of aluminum hydroxide formed in the electrochemical graining using an alternating current in the preceding step were removed and also, the edge portions of pits formed were dissolved to make the edge portions smooth. Thereafter, water washing was carried out by spraying well water.

(f) Desmut Treatment

A desmut treatment was carried out by spraying an aqueous solution having a sulfuric acid concentration of 15% by weight (containing 4.5% by weight of aluminum ion) having a temperature of 30° C., and thereafter, water washing was carried out by spraying well water. As the aqueous nitric acid solution used in the desmut treatment, waste liquid from the above-described step of carrying out electrochemical graining using alternating current in an aqueous nitric acid solution was employed.

(g) Electrochemical Graining Treatment

Using an alternating current of 60 Hz, an electrochemical graining treatment was continuously carried out. The electrolyte used was an aqueous solution of 7.5 g/liter of hydrochloric acid (containing 5 g/liter of aluminum ion) and the temperature was 35° C. The electrochemical graining treatment was conducted using an alternating current source which provides a rectangular wave alternating current and using a carbon electrode as a counter electrode. A ferrite was used as an auxiliary anode. As an electrolysis vessel, a radial cell type was used.

The current density was 25 A/$dm^2$ in the peak value of the electric current and the quantity of electricity was 50 C/$dm^2$ in terms of the total quantity of electricity during the aluminum plate functioning as an anode.

Thereafter, water washing was carried out by spraying well water.

(h) Alkali Etching Treatment

The aluminum plate was subjected to an etching treatment by spraying an aqueous solution having a sodium hydroxide concentration of 26% by weight and an aluminum ion concentration of 6.5% by weight at 32° C. to dissolve 0.10 $g/m^2$ of the aluminum plate, whereby the smut components mainly composed of aluminum hydroxide formed in the electrochemical graining using alternating current in the preceding step were removed and also, the edge portions of pits formed were dissolved to make the edge portions smooth. Thereafter, water washing was carried out by spraying well water.

(i) Desmut Treatment

A desmut treatment was carried out by spraying an aqueous solution having a sulfuric acid concentration of 25% by weight (containing 0.5% by weight of aluminum ion) having a temperature of 60° C., and thereafter, water washing was carried out by spraying well water.

(j) Anodizing Treatment

An anodizing treatment was carried out using sulfuric acid as an electrolyte. The electrolyte had a sulfuric acid concentration of 170 g/liter (containing 0.5% by weight of aluminum ion) and the temperature was 43° C. Thereafter, water washing was carried out by spraying well water.

The current density was about 30 $A/dm^2$. The final amount of the oxidized film formed was 2.7 $g/m^2$.

<Support A>

Each of the steps (a) to (j) was performed in order except that the amount of etching in the step (e) was changed to 3.4 g to prepare Support A.

<Support B>

Each of the steps (a) to (j) was performed in order except that the steps (g), (h) and (i) were omitted to prepare Support B.

<Support C>

Each of the steps (a) to (j) was performed in order except that the steps (a), (g), (h) and (i) were omitted to prepare Support C.

<Support D>

Each of the steps (a) to (j) was performed in order except that the steps (a), (d), (e) and (f) were omitted and that the total quantity of electricity in the step (g) was changed to 450 $C/dm^2$ to prepare Support D.

Each of Supports A, B, C and D thus prepared was then subjected to the hydrophilicization treatment and undercoating treatment described below.

(k) Alkali Metal Silicate Treatment

By immersing the aluminum support obtained by the anodizing treatment in a treatment vessel containing an aqueous solution of 1% by weight 3# sodium silicate having a temperature of 30° C. for 10 seconds, an alkali metal silicate treatment (silicate treatment) was carried out. Thereafter, water washing was carried out by spraying well water. The amount of silicate attached was 3.8 $mg/m^2$.

(Formation of Undercoat Layer)

An undercoat solution having the composition described below was coated on the aluminum support after the alkali metal silicate treatment obtained above followed by drying at 80° C. for 15 seconds to form an undercoat layer. The coverage of the undercoat layer after drying was 18 $mg/m^2$.

<Composition of Undercoat Solution>

| | |
|---|---|
| Polymer compound described below | 0.3 g |
| Methanol | 100 g |
| Water | 1.0 g |

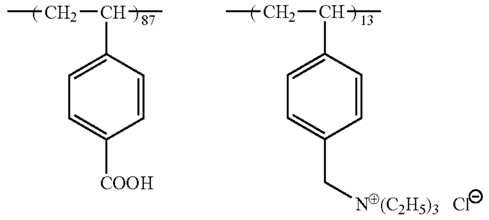

Weight average molecular weight: 18,000

EXAMPLES 1 TO 8 AND COMPARATIVE EXAMPLES 1 TO 2

The coating solution for first layer (lower image-forming layer) having the composition shown below was coated on the support described above by a wire bar and dried using a drying oven of 150° C. for 60 seconds to form a first layer having the coating amount of 0.80 $g/m^2$.

On the first layer formed on the support described above, the coating solution for second layer (upper image-forming layer) having the composition shown below was coated by a wire bar, followed by drying at 145° C. for 70 seconds by a drying oven so that the total coating amount of the image-forming layer was 1.0 $g/m^2$. Thus, positive-working lithographic printing plate precursors for Examples 1 to 8 and Comparative Examples 1 to 2 were prepared.

<Coating Solution for First Layer (Lower Image-forming Layer)>

| | |
|---|---|
| Copolymer of N-(p-aminosulfonylphenyl)-methacrylamide, methyl methacrylate and acrylonitrile (molar ratio: 37/33/30; weight average molecular weight: 58,000; including 0.2 wt % of N-(p-aminosulfonylphenyl)-methacrylamide as unreacted monomer) | 2.133 g |
| Cyanine dye (L-2) | 0.098 g |
| 2-Mercapto-5-methylthio-1,3,4-thiadiazole | 0.030 g |
| cis-$\Delta^4$-Tetrahydrophthalic anhydride | 0.100 g |
| 4,4'-Sulfonyldiphenol | 0.090 g |
| p-Toluenesulfonic acid | 0.008 g |
| Compound obtained by replacing counter anion of Ethyl Violet with 6-hydroxynaphthalenesulfonate | 0.100 g |
| 3-Methoxy-4-diazodiphenylamine hexafluorophosphate (heat-decomposable compound) | 0.030 g |

-continued

| | |
|---|---|
| Fluorine-containing surfactant (Polymer-1 shown below) | 0.035 g |
| Methyl ethyl ketone | 26.6 g |
| 1-Methoxy-2-propanol | 13.6 g |
| γ-Butyrolactone | 13.8 g |

Polymer-1

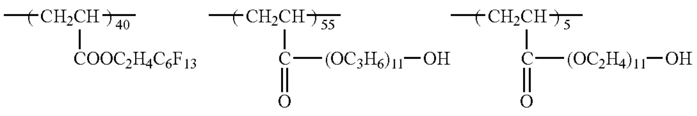

<Coating Solution for Second Layer (Upper Image-forming Layer)>

| | |
|---|---|
| Copolymer of ethyl methacrylate and 2-methacryloyloxyethyl succinate (molar ratio: 67/33; weight average molecular weight: 90,000) | 0.042 g |
| Cresol novolak resin (PR-54046 manufactured by Sumitomo Bakelite Co., Ltd.) | 0.348 g |
| Infrared absorbing agent shown in Table 1 below | amount shown in Table 1 below |
| 1-(4-Methylbenzyl)-1-phenylpiperidium 5-benzoyl-4-hydroxy-2-methoxybenzene sulfonate | 0.004 g |
| Fluorine-containing surfactant (Polymer-1 shown above) | 0.015 g |
| Fluorine-containing surfactant (Polymer-2 shown below) | 0.003 g |
| Methyl ethyl ketone | 13.1 g |
| 1-Methoxy-2-propanol | 6.79 g |

Polymer-2

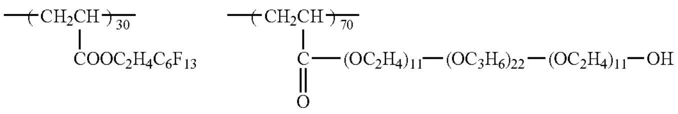

[Evaluation of Lithographic Printing Plate Precursor]

(Evaluation of Development Latitude)

Each of the photosensitive lithographic printing plate precursors thus-obtained was stored under the conditions of temperature of 25° C. and relative humidity of 50% for 5 days and then a test pattern was imagewise drawn on the lithographic printing plate precursor at a beam intensity of 9.0 W and a drum rotation speed of 150 rpm using Trendsetter 3244VX manufactured by Creo Inc.

The lithographic printing plate precursor was developed using PS Processor 900H, manufactured by Fuji Photo film Co., Ltd., charged with a developer prepared by adjusting electric conductivity with varying a diluting ratio due to changing the amount of water added to each of Alkali Developers A and B having the compositions described below while maintaining a developer temperature at 30° C. for a developing time of 22 seconds. Among the developers with which the development was favorably conducted and both dissolution of the image area and stain or coloration caused by the residual film of the image-forming layer in the non-image area due to development inferior were prevented, that having the highest electric conductivity and that having the lowest electric conductivity were selected, and the difference of the electric conductivity between these developers was determined to evaluate the development latitude. The results are shown in Table 1 below.

| <Composition of Alkali Developer A> | |
|---|---|
| $SiO_2 \cdot K_2O$ ($K_2O/SiO_2$ = 1/1 in molar ratio) | 4.0 parts by weight |
| Citric acid | 0.5 parts by weight |
| Polyethylene glycol lauryl ether (weight average molecular weight: 1,000) | 0.5 parts by weight |
| Water | 95.0 parts by weight |
| **<Composition of Alkali Developer B>** | |
| D-Sorbit | 2.5 parts by weight |
| Sodium hydroxide | 0.85 parts by weight |
| Polyethylene glycol lauryl ether (weight average molecular weight: 1,000) | 0.5 parts by weight |
| Water | 96.15 parts by weight |

(Evaluation of Sensitivity)

A test pattern was imagewise drawn on each of the lithographic printing plate precursors using Trendsetter 3244VX manufactured by Creo Inc. with changing an exposure energy.

Then, the exposed lithographic printing plate precursors were developed with a developer having an electric conductivity of intermediate value (average value) between the highest electric conductivity and the lowest electric conductivity among the developers with which the development was favorably conducted and both dissolution of the image area and stain or coloration caused by the residual film of the image-forming layer in the non-image area due to development inferior were prevented as described in the evaluation of development latitude, and an exposure energy (a beam intensity at a drum rotation speed of 150 rpm) sufficient for developing the non-image area with the developer was determined to evaluate the sensitivity. It is evaluated that as the value is smaller, the sensitivity is higher.

(Evaluation of Preservation Stability)

Each of the lithographic printing plate precursors was stored under the conditions of temperature of 35° C. and relative humidity of 75% for 21 days and then sensitivity was measured in the same manner as in the evaluation of sensitivity described above. It is evaluated that as the difference of sensitivities before and after the storage is smaller, the preservation stability is better.

| <Coating solution for first layer (lower image-forming layer)> | |
|---|---|
| Copolymer of N-(p-aminosulfonylphenyl)-acrylamide, methyl methacrylate and acrylonitrile (molar ratio: 36/34/30; weight average molecular weight: 69,000; including 0.9 wt % of N-(p-aminosulfonylphenyl)-acrylamide as unreacted monomer) | 2.133 g |
| Cyanine dye (S-14) | 0.098 g |
| 2-Mercapto-5-methylthio-1,3,4-thiadiazole | 0.030 g |
| cis-$\Delta^4$-Tetrahydrophthalic anhydride | 0.100 g |
| 4,4'-Sulfonyldiphenol | 0.090 g |
| p-Toluenesulfonic acid | 0.008 g |
| Compound obtained by replacing counter anion of Ethyl Violet with 6-hydroxynaphthalenesulfonate | 0.120 g |
| Fluorine-containing surfactant (Polymer-1 shown above) | 0.035 g |
| Methyl ethyl ketone | 26.6 g |
| 1-Methoxy-2-propanol | 13.6 g |
| γ-Butyrolactone | 13.8 g |

TABLE 1

| | | Infrared Absorbing Agent | | Development Latitude (mS/cm) | | Sensitivity (W) | | Sensitivity after Storage (W) | |
|---|---|---|---|---|---|---|---|---|---|
| | Support | Compound | Amount (g) | Developer A | Developer B | Developer A | Developer B | Developer A | Developer B |
| Example 1 | A | L-2<br>S-6 | 0.010<br>0.009 | 6 | 7 | 5.5 | 5.5 | 6.5 | 6.5 |
| Example 2 | B | L-11<br>S-14 | 0.012<br>0.007 | 6 | 6 | 5.5 | 5.5 | 6.5 | 6.5 |
| Example 3 | C | L-16<br>S-14 | 0.010<br>0.009 | 6 | 6 | 5.0 | 5.0 | 5.5 | 6.0 |
| Example 4 | D | L-2<br>S-2 | 0.011<br>0.008 | 6 | 7 | 5.0 | 5.0 | 5.5 | 5.5 |
| Example 5 | D | L-5<br>L-21<br>S-29 | 0.007<br>0.006<br>0.006 | 6 | 7 | 5.5 | 5.5 | 5.5 | 6.0 |
| Example 6 | C | L-22<br>S-22 | 0.007<br>0.012 | 5 | 6 | 5.5 | 5.0 | 6.5 | 6.0 |
| Example 7 | A | L-23<br>S-1 | 0.010<br>0.009 | 6 | 6 | 5.5 | 6.0 | 6.5 | 6.5 |
| Example 8 | A | L-25<br>S-2 | 0.011<br>0.008 | 6 | 6 | 5.5 | 6.0 | 5.5 | 6.0 |
| Comparative Example 1 | A | — | 0 | — | — | 10.0 | 10.0 | 12.5 | 12.0 |
| Comparative Example 2 | A | S-2 | 0.019 | 5 | 4 | 6.5 | 6.5 | 9.5 | 10.5 |

EXAMPLES 9 TO 12 AND COMPARATIVE EXAMPLE 3

On the silicate-treated support described above, the undercoat solution described above was coated in the same manner as in Examples 1 to 8, then the coating solution for first layer (lower image-forming layer) having the composition shown below was coated thereon by a wire bar and dried using a drying oven of 150° C. for 60 seconds to form a first layer having the coating amount of 0.9 $g/m^2$.

On the first layer formed on the support described above, the coating solution for second layer (upper image-forming layer) having the composition shown below was coated by a wire bar, followed by drying at 145° C. for 70 seconds by a drying oven so that the total coating amount of the image-forming layer was 1.2 $g/m^2$. Thus, each positive-working lithographic printing plate precursor was prepared.

-continued

| <Coating solution for second layer (upper image-forming layer)> | |
|---|---|
| Copolymer of ethyl methacrylate and 2-methacryloyloxyethyl succinate (molar ratio: 67/33; weight average molecular weight: 110,000) | 0.030 g |
| Cresol novolak resin (PR-54046 manufactured by Sumitomo Bakelite Co., Ltd.) | 0.320 g |
| Infrared absorbing agent shown in Table 2 below | amount shown in Table 2 below |
| 1-(4-Methylbenzyl)-1-phenylpiperidium 5-benzoyl-4-hydroxy-2-methoxybenzene sulfonate | 0.005 g |
| Compound obtained by replacing counter anion of Ethyl Violet with 6-hydroxynaphthalenesulfonate | 0.007 g |

-continued

| | |
|---|---|
| Fluorine-containing surfactant (Polymer-1 shown above) | 0.022 g |
| 1-Methoxy-2-propanol | 19.9 g |

(Evaluations of Development Latitude, Sensitivity and Preservation Stability)

Each of the lithographic printing plate precursors thus-obtained was subjected to the exposure and development in the same manner as in Examples 1 to 8 except for changing the exposure apparatus to Luxel Platesetter T-6000 manufactured by Fuji Photo Film Co., Ltd., thereby evaluating the development latitude, sensitivity and preservation stability. However, the sensitivity was evaluated by a beam intensity at a drum rotation speed of 900 rpm. The results are shown in Table 2 below.

The lithographic printing plate precursor according to the invention has the image-forming layer of multi-layer structure containing at least two kinds of infrared absorbing agents in at least one of the first layer and the second layer, preferably in the second layer (upper image-forming layer). More preferably, the two or more kinds of infrared absorbing agents are a mixture comprising at least one kind of infrared absorbing agent having an absorption maximum wavelength of not shorter than 825 nm and at least one kind of infrared absorbing agent having an absorption maximum wavelength of shorter than 825 nm. Thus, the lithographic printing plate precursor, which has high sensitivity regardless of the variation of a light source of an exposure apparatus used at the image formation, has a large allowance to fluctuation of concentration in the alkali developer and is excellent in the storage stability (preservation stability) of preventing the occurrence of aggregation of the infrared absorbing dye with the lapse of time, can be obtained. The lithographic printing plate precursor has an extremely high utility.

TABLE 2

| | | Infrared Absorbing Agent | | Development Latitude (mS/cm) | | Sensitivity (W) | | Sensitivity after Storage (W) | |
|---|---|---|---|---|---|---|---|---|---|
| | Support | Compound | Amount (g) | Developer A | Developer B | Developer A | Developer B | Developer A | Developer B |
| Example 9 | A | L-3<br>S-2 | 0.010<br>0.009 | 5 | 6 | 50 | 45 | 60 | 50 |
| Example 10 | B | L-2<br>S-6 | 0.010<br>0.009 | 5 | 6 | 50 | 50 | 55 | 60 |
| Example 11 | C | L-16<br>S-19 | 0.010<br>0.009 | 6 | 6 | 40 | 45 | 45 | 50 |
| Example 12 | D | L-22<br>S-21 | 0.010<br>0.009 | 6 | 6 | 40 | 45 | 50 | 55 |
| Comparative Example 3 | A | L-3 | 0.019 | 4 | 5 | 55 | 55 | 90 | 85 |

COMPARATIVE EXAMPLE 4

On Support A described above, the silicate treatment and coating of undercoat solution were conducted in the same manner as in Examples 1 to 8, then without coating the coating solution for first layer, only the coating solution for second layer described in Examples 1 to 8 was coated by a wire bar and dried using a drying oven of 150° C. for 60 seconds to form an image-forming layer having the coating amount of 1.0 g/$m^2$.

(Evaluations of Development Latitude, Sensitivity and Preservation Stability)

The lithographic printing plate precursor thus-obtained was subjected to the exposure and development in the same manner as in Examples 1 to 8, thereby evaluating the development latitude, sensitivity and preservation stability. The results are shown in Table 3 below.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor capable of forming an image upon irradiation with an infrared laser comprising in the order recited a support, a first layer containing as the main component an alkali-soluble resin and a second layer containing (a) as the main component, an

TABLE 3

| | | Infrared Absorbing Agent | | Development Latitude (mS/cm) | | Sensitivity (W) | | Sensitivity after Storage (W) | |
|---|---|---|---|---|---|---|---|---|---|
| | Support | Compound | Amount (g) | Developer A | Developer B | Developer A | Developer B | Developer A | Developer B |
| Comparative Example 4 | A | L-2<br>S-6 | 0.010<br>0.009 | 2 | 2 | 9.5 | 10.0 | 10.0 | 11.0 |

alkali-soluble resin that is different from the alkali-soluble resin contained as the main component in the first layer and (b) a mixture comprising at least one kind of cyanine dye infrared absorbing agent having an absorption maximum wavelength of not shorter than 825 nm and at least one kind of cyanine dye infrared absorbing agent having an absorption maximum wavelength of shorter than 825 nm, wherein the alkali-soluble resin contained in the second layer is an alkali-soluble resin having a phenol group or an alkali-soluble resin having a sulfonamido group, and the difference of the absorption maximum wavelengths of the two kinds of cyanine dye infrared absorbing agents is not less than 15 nm and not more than 50 nm.

2. The lithographic printing plate precursor as claimed in claim 1, wherein the cyanine dye infrared absorbing agents are cyanine dyes represented by the following formula (a):

(a)

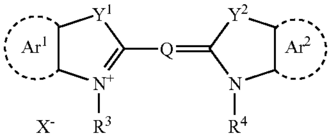

wherein $R^3$ and $R^4$ each independently represent an alkyl group having from 1 to 12 carbon atoms, which may have a substituent selected from an alkoxy group, an aryl group, an amido group, an alkoxycarbonyl group, a hydroxy group, a sulfo group and a carboxy group; $Y^1$ and $Y^2$ each independently represent an oxygen atom, a sulfur atom, a selenium atom, a dialkylmethylene group or —CH=CH—; $Ar^1$ and $Ar^2$ each independently represent an aromatic hydrocarbon group, which may have a substituent selected from an alkyl group, an alkoxy group, a halogen atom and an alkoxycarbonyl group, or $Ar^1$ and $Ar^2$ each may form a condensed aromatic ring together with the adjacent two carbon atoms connected to $Y^1$ or $Y^2$; $X^-$ represents a counter ion necessary for neutralization of charge, and it is not always necessary in the case wherein the dye cation portion has an anionic substituent; and Q represents a polymethine group selected from a trimethine group, a pentamethine group, a heptamethine group, a nonamethine group and an undecamethine group.

3. The lithographic printing plate precursor as claimed in claim 1, wherein the cyanine dye infrared absorbing agents are cyanine dyes represented by the following formula (a-1):

(a-1)

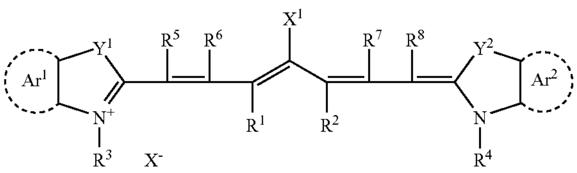

wherein $X^1$ a hydrogen atom or a halogen atom; $R^1$ and $R^2$ each independently represent a hydrocarbon group having from 1 to 12 carbon atoms, or $R^1$ and $R^2$ are connected with each other to form a 5-membered or 6-membered ring; $Ar^1$ and $Ar^2$, which may be the same or different, each represent an aromatic hydrocarbon group, which may have a substituent; $Y^1$ and $Y^2$, which may be the same or different, each represent a sulfur atom or a dialkylmethylene group having not more than 12 carbon atoms; $R^3$ and $R^4$, which may be the same or different, each represent a hydrocarbon group having not more than 20 carbon atoms, which may have a substituent; $R^5$, $R^6$, $R^7$ and $R^8$, which may be the same or different, each represent a hydrogen atom or a hydrocarbon group having not more than 12 carbon atoms; $X^-$ represents a counter anion necessary for neutralization of charge, and it is not necessary in the case wherein any one of $R^1$ to $R^8$ is substituted with an anionic substituent.

4. The lithographic printing plate precursor as claimed in claim 1, wherein the alkali-soluble resin contained in the first layer is an acryl resin, a urethane resin or a butyral resin.

5. The lithographic printing plate precursor as claimed in claim 1, wherein a mixing weight ratio of the cyanine dye infrared absorbing agent having an absorption maximum wavelength of not shorter than 825/the cyanine dye infrared absorbing agent having an absorption maximum wavelength of shorter than 825 is from 10/90 to 90/10.

6. A lithographic printing plate precursor capable of forming an image upon irradiation with an infrared laser comprising in the order recited a support, a first layer containing as the main component an alkali-soluble resin and a second layer containing (a) as the main component, an alkali-soluble resin that is different from the alkali-soluble resin contained as the main component in the first layer and (b) a mixture comprising at least one kind of cyanine dye infrared absorbing agent having an absorption maximum wavelength of not shorter than 825 nm and at least one kind of cyanine dye infrared absorbing agent having an absorption maximum wavelength of shorter than 825 nm, wherein the alkali-soluble resin contained in the first layer is an acryl resin, a urethane resin or a butyral resin, and the difference of the absorption maximum wavelengths of the two kinds of cyanine dye infrared absorbing agents is not less than 15 nm and not more than 50 nm.

7. The lithographic printing plate precursor as claimed in claim 6, wherein the cyanine dye infrared absorbing agents are cyanine dyes represented by the following formula (a):

(a)

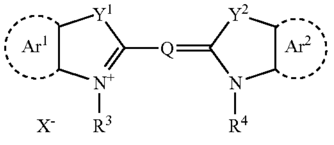

wherein $R^3$ and $R^4$ each independently represent an alkyl group having from 1 to 12 carbon atoms, which may have a substituent selected from an alkoxy group, an aryl group, an amido group, an alkoxycarbonyl group, a hydroxy group, a sulfo group and a carboxy group; $Y^1$ and $Y^2$ each independently represent an oxygen atom, a sulfur atom, a selenium atom, a dialkylmethylene group or —CH=CH—; $Ar^1$ and $Ar^2$ each independently represent an aromatic hydrocarbon group, which may have a substituent selected from an alkyl group, an alkoxy group, a halogen atom and an alkoxycarbonyl group, or $Ar^1$ and $Ar^2$ each may form a condensed aromatic ring together with the adjacent two carbon atoms connected to $Y^1$ or $Y^2$; $X^-$ represents a counter ion necessary for neutralization of charge, and it is not always necessary in the case wherein the dye cation portion has an anionic substituent; and Q represents a polymethine group selected from a trimethine group, a pentamethine group, a heptamethine group, a nonamethine group and an undecamethine group.

8. The lithographic printing plate precursor as claimed in claim 6, wherein the cyanine dye infrared absorbing agents are cyanine dyes represented by the following formula (a-1):

(a-1)

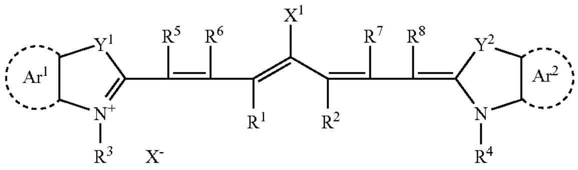

wherein $X^1$ represents a hydrogen atom or a halogen atom; $R^1$ and $R^2$ each independently represent a hydrocarbon group having from 1 to 12 carbon atoms, or $R^1$ and $R^2$ are connected with each other to form a 5-membered or 6-membered ring; $Ar^1$ and $Ar^2$, which may be the same or different, each represent an aromatic hydrocarbon group, which may have a substituent; $Y^1$ and $Y^2$, which may be the same or different, each represent a sulfur atom or a dialkylmethylene group having not more than 12 carbon atoms; $R^3$ and $R^4$, which may be the same or different, each represent a hydrocarbon group having not more than 20 carbon atoms, which may have a substituent; $R^5$, $R^6$, $R^7$ and $R^8$, which may be the same or different, each represent a hydrogen atom or a hydrocarbon group having not more than 12 carbon atoms; $X^-$ represents a counter anion necessary for, neutralization of charge, and it is not necessary in the case wherein any one of $R^1$ to $R^8$ is substituted with an anionic substituent.

9. The lithographic printing plate precursor as claimed in claim 6, wherein a mixing weight ratio of the cyanine dye infrared absorbing agent having an absorption maximum wavelength of not shorter than 825/the cyanine dye infrared absorbing agent having an absorption maximum wavelength of shorter than 825 is from 10/90 to 90/10.

* * * * *